United States Patent
Sato et al.

(10) Patent No.: US 11,206,729 B2
(45) Date of Patent: Dec. 21, 2021

(54) POWER CIRCUIT DEVICE

(71) Applicant: MITSUBISHI ELECTRIC CORPORATION, Tokyo (JP)

(72) Inventors: Shota Sato, Tokyo (JP); Koji Nakajima, Tokyo (JP); Takashi Kumagai, Tokyo (JP); Yuji Shirakata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 326 days.

(21) Appl. No.: 16/094,561

(22) PCT Filed: Apr. 25, 2017

(86) PCT No.: PCT/JP2017/016366
§ 371 (c)(1),
(2) Date: Oct. 18, 2018

(87) PCT Pub. No.: WO2017/188246
PCT Pub. Date: Nov. 2, 2017

(65) Prior Publication Data
US 2019/0110355 A1 Apr. 11, 2019

(30) Foreign Application Priority Data
Apr. 26, 2016 (JP) .............................. JP2016-087939

(51) Int. Cl.
*H05K 1/18* (2006.01)
*H05K 1/02* (2006.01)
(Continued)

(52) U.S. Cl.
CPC ............ *H05K 1/0206* (2013.01); *H02M 3/28* (2013.01); *H02M 3/33569* (2013.01);
(Continued)

(58) Field of Classification Search
CPC ...... H05K 1/0206; H05K 1/181; H05K 1/182; H05K 7/205; H05K 7/20509; H05K 7/209;
(Continued)

(56) References Cited

U.S. PATENT DOCUMENTS 6,005,773 A * 12/1999 Rozman .................. H02M 3/00
361/707
6,380,836 B2 * 4/2002 Matsumoto ......... H01F 27/2804
336/200
(Continued)

FOREIGN PATENT DOCUMENTS

| CN | 1585248 A | 2/2005 |
|---|---|---|
| JP | H1140425 A | 2/1999 |

(Continued)

OTHER PUBLICATIONS

International Search Report (with English Translation) and Written Opinion issued in corresponding International Patent Application No. PCT/JP2017/016366, 9 pages (dated Jun. 27, 2017).
(Continued)

*Primary Examiner* — Mang Tin Bik Lian
(74) *Attorney, Agent, or Firm* — Buchanan Ingersoll & Rooney PC

(57) ABSTRACT

Provided is a highly reliable power circuit device. The power circuit device includes a printed substrate, a power circuit, and a housing. The power circuit is formed on the printed substrate. The housing is connected with the printed substrate. The power circuit includes secondary-side switching elements, at least one smoothing choke coil, and smoothing capacitors. Portions of a smoothing choke coil core serving as a core of the smoothing choke coil are inserted in opening portions formed in the printed substrate. A winding of the smoothing choke coil is formed on the printed substrate. The smoothing choke coil is located between a
(Continued)

region C in which the smoothing capacitors are arranged and regions A and B serving as a second region in which primary-side switching elements and the secondary-side switching elements serving as electric elements are arranged.

13 Claims, 14 Drawing Sheets

(51) Int. Cl.
- *H02M 3/28* (2006.01)
- *H02M 3/335* (2006.01)
- *H05K 7/20* (2006.01)

(52) U.S. Cl.
CPC ............. *H05K 1/181* (2013.01); *H05K 1/182* (2013.01); *H05K 7/205* (2013.01); *H05K 7/209* (2013.01); *H05K 7/20509* (2013.01); H05K 2201/062 (2013.01); H05K 2201/09072 (2013.01); H05K 2201/1003 (2013.01); H05K 2201/10015 (2013.01); H05K 2201/10166 (2013.01)

(58) Field of Classification Search
CPC ... H05K 2201/062; H05K 2201/09072; H05K 2201/10015; H05K 2201/10166; H05K 2201/1003; H02M 3/33569; H02M 3/28
See application file for complete search history.

(56) References Cited

U.S. PATENT DOCUMENTS

| | | | | |
|---|---|---|---|---|
| 7,830,649 | B2* | 11/2010 | Yang | H05B 41/02 361/674 |
| 2004/0190244 | A1* | 9/2004 | Tsuchiya | H05K 7/1432 361/688 |
| 2005/0052888 | A1 | 3/2005 | Takeshima et al. | |
| 2007/0047266 | A1* | 3/2007 | Nakahori | H01F 38/00 363/17 |
| 2010/0007358 | A1* | 1/2010 | Schaerrer | G01R 15/14 324/649 |
| 2010/0164670 | A1 | 7/2010 | Nakahori et al. | |
| 2014/0029324 | A1* | 1/2014 | Sanae | H05K 7/209 363/141 |
| 2014/0321065 | A1* | 10/2014 | Nishimura | H02M 3/28 361/722 |
| 2015/0048917 | A1* | 2/2015 | Uchiyama | H05K 7/1432 336/200 |
| 2015/0189794 | A1* | 7/2015 | Tashima | H05K 7/1432 180/446 |
| 2015/0245537 | A1* | 8/2015 | Sakuma | H05K 7/20909 363/141 |
| 2015/0274197 | A1* | 10/2015 | Saito | H02P 27/06 318/400.29 |
| 2016/0035481 | A1* | 2/2016 | Hachiya | H05K 1/165 336/61 |
| 2016/0086723 | A1* | 3/2016 | Su | H01F 17/0033 336/200 |
| 2016/0372250 | A1* | 12/2016 | Chida | H01F 27/2866 |

FOREIGN PATENT DOCUMENTS

| | | | |
|---|---|---|---|
| JP | 11094593 A | * | 4/1999 |
| JP | 2000014149 A | * | 1/2000 |
| JP | 2000014149 A | | 1/2000 |
| JP | 2010153724 A | | 7/2010 |
| JP | 2011139602 A | | 7/2011 |
| JP | 2012019150 A | | 1/2012 |
| JP | 2012105401 A | | 5/2012 |
| JP | 2016039698 A | | 3/2016 |

OTHER PUBLICATIONS

Office Action dated Jan. 21, 2020, issued in corresponding Chinese Patent Application No. 201780023894.8, 22 pages including 12 pages of English translation.

Office Action dated Aug. 14, 2020, issued in corresponding Chinese Patent Application No. 201780023894.8, 18 pages including 10 pages of English translation.

* cited by examiner

101

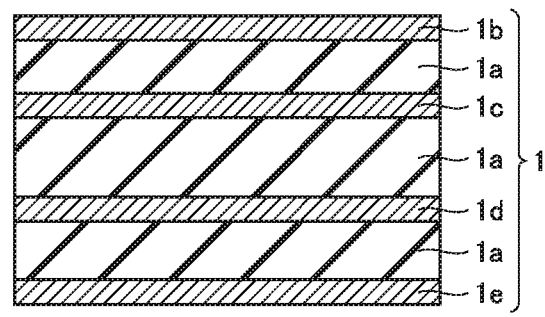
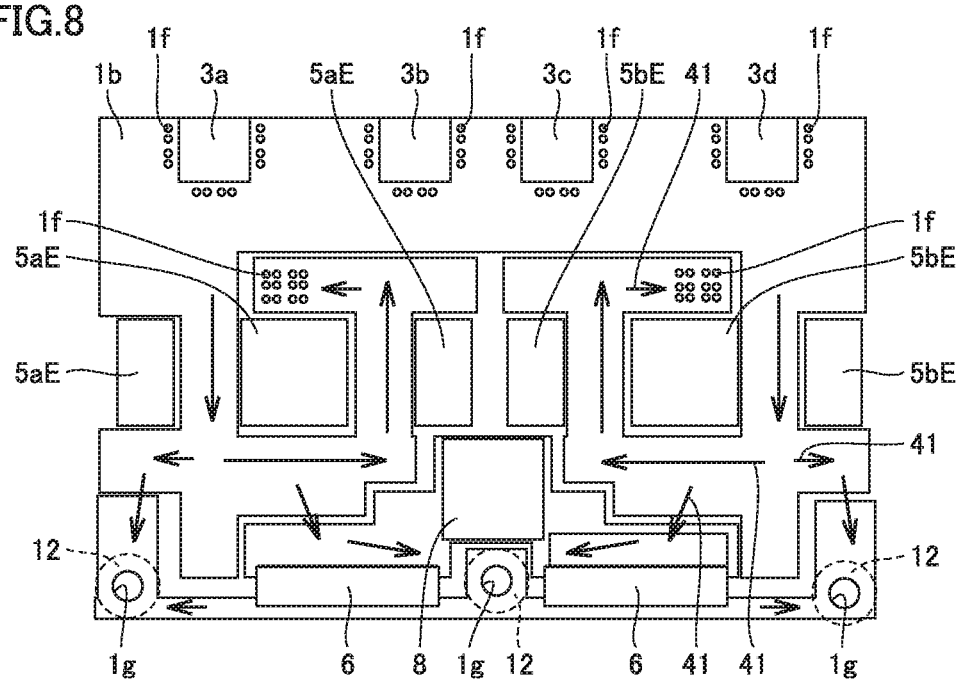

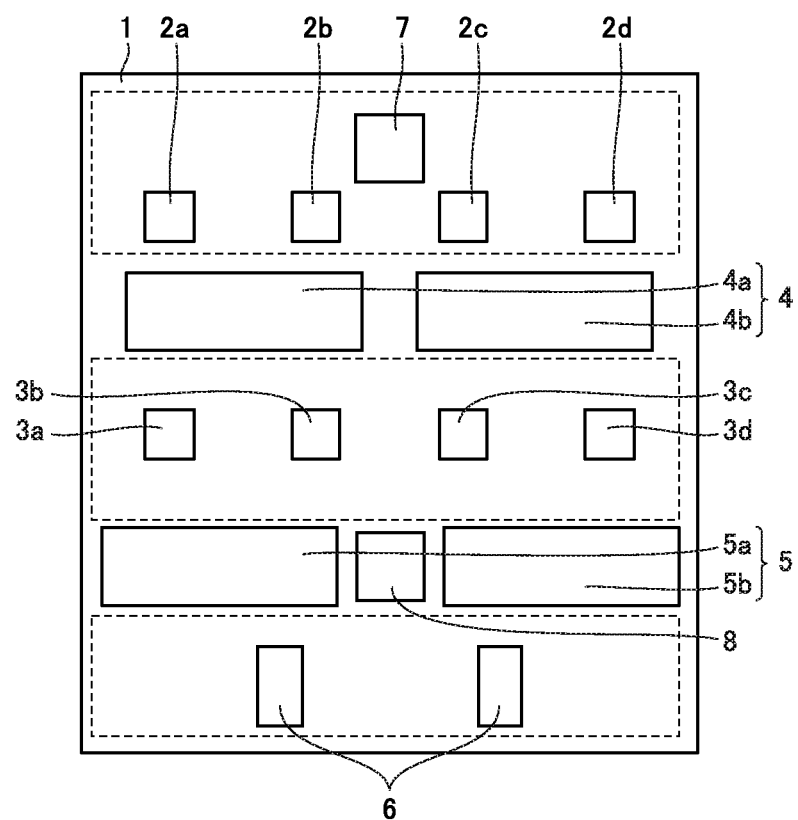

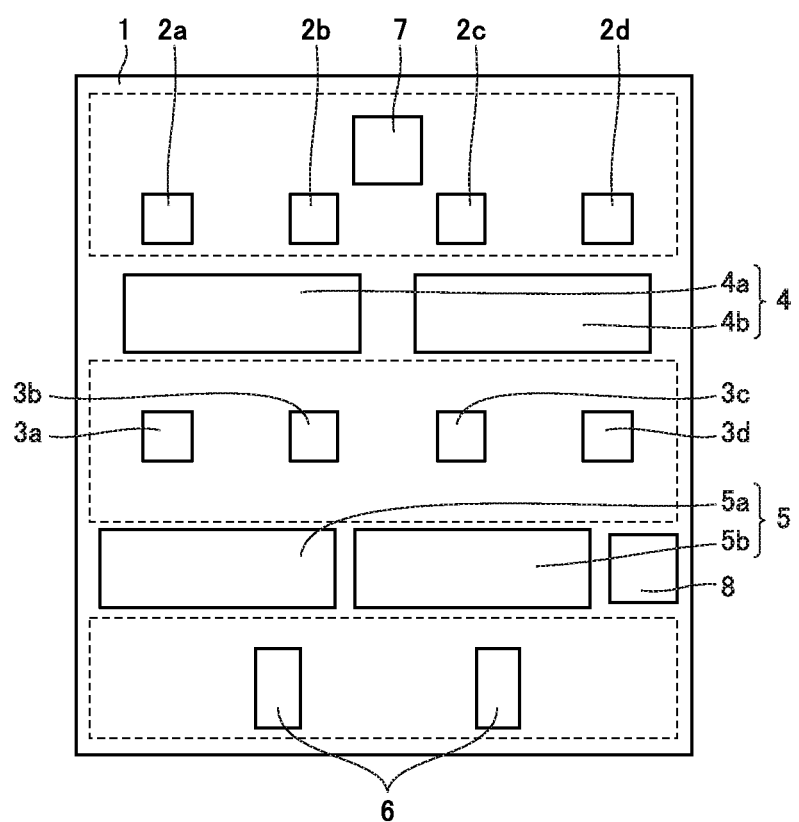

POWER CIRCUIT DEVICE

TECHNICAL FIELD

The present invention relates to a power circuit device, and more particularly to a power circuit device which dissipates heat generated from a power circuit to the outside.

BACKGROUND ART

In recent years, power circuit devices used for vehicle-mounted or vehicular large-capacity industrial apparatuses have been required to have more functions, a higher output, and a thinner size. Accordingly, electronic components mounted in a power circuit device have been required to have higher heat resistance and higher heat dissipation.

An exemplary configuration of such an electronic component having higher heat resistance and higher heat dissipation is disclosed for example in Japanese Patent Laying-Open No. 2011-139602 (hereafter referred to as PTD 1). In a power supply device disclosed in PTD 1, switching elements constituting the power supply device and generating a large heat are directly fixed to a housing. Heat dissipation property is improved by directly fixing the switching elements to the housing as described above. In the power circuit device, since a large current flows to a winding of a choke coil constituting a smoothing circuit, the winding is thickened to reduce heat generation in the winding. In the power circuit device, a component in which a core and the winding of the choke coil are integrated is connected to a circuit substrate.

CITATION LIST

Patent Document

PTD 1: Japanese Patent Laying-Open No. 2011-139602

SUMMARY OF INVENTION

Technical Problem

In the power supply device disclosed in PTD 1, the switching elements are directly fixed to the housing as described above, and the choke coil is connected as a separate component to a printed substrate. Accordingly, the number of assembly steps is increased, resulting in an increase in the manufacturing cost of the device. To deal with such a problem of the increase in manufacturing cost, it is conceivable to mount electronic components such as switching elements on a circuit substrate to simplify a mounting process.

Here, a power circuit device includes a smoothing capacitor as one of electronic components constituting a smoothing circuit. In a case where components such as a switching element and a transformer generate heat and the temperature thereof is increased, the smoothing capacitor having a low heat-resistance temperature receives heat through a wiring pattern of a circuit substrate and the air in a housing of the power circuit device. As a result, the smoothing capacitor may be broken by the heat, and it is difficult to secure the reliability of the power circuit device.

The present invention has been made to solve the aforementioned problem, and an object of the present invention is to provide a highly reliable power circuit device.

Solution to Problem

A power circuit device in accordance with the present invention includes a circuit substrate, a power circuit, and a housing. The power circuit is formed on the circuit substrate. The housing is connected with the circuit substrate. The power circuit includes an electric element, at least one coil, and a capacitor. The coil smoothes a current flowing through the power circuit. The capacitor smoothes a current output from the coil. A portion of a core of the coil is inserted in an opening portion formed in the circuit substrate. A winding of the coil is formed on the circuit substrate. The coil is located between a first region in which the capacitor is arranged and a second region in which the electric element is arranged.

Advantageous Effects of Invention

According to the power circuit device in accordance with the present invention, an increase in the temperature of the capacitor of the power circuit can be mitigated. Accordingly, a highly reliable power circuit device which can be used for a long time can be obtained.

BRIEF DESCRIPTION OF DRAWINGS

FIG. 7 is a partial schematic cross sectional view of a printed substrate of the power circuit device shown in FIG. 2.

FIG. 8 is a partial schematic top view of the printed substrate of the power circuit device shown in FIG. 2.

FIG. 21 is a schematic top view of a power circuit device in accordance with a sixth embodiment of the present invention.

FIG. 22 is a schematic top view of a variation of the power circuit device shown in FIG. 21.

DESCRIPTION OF EMBODIMENTS

Figure 1:
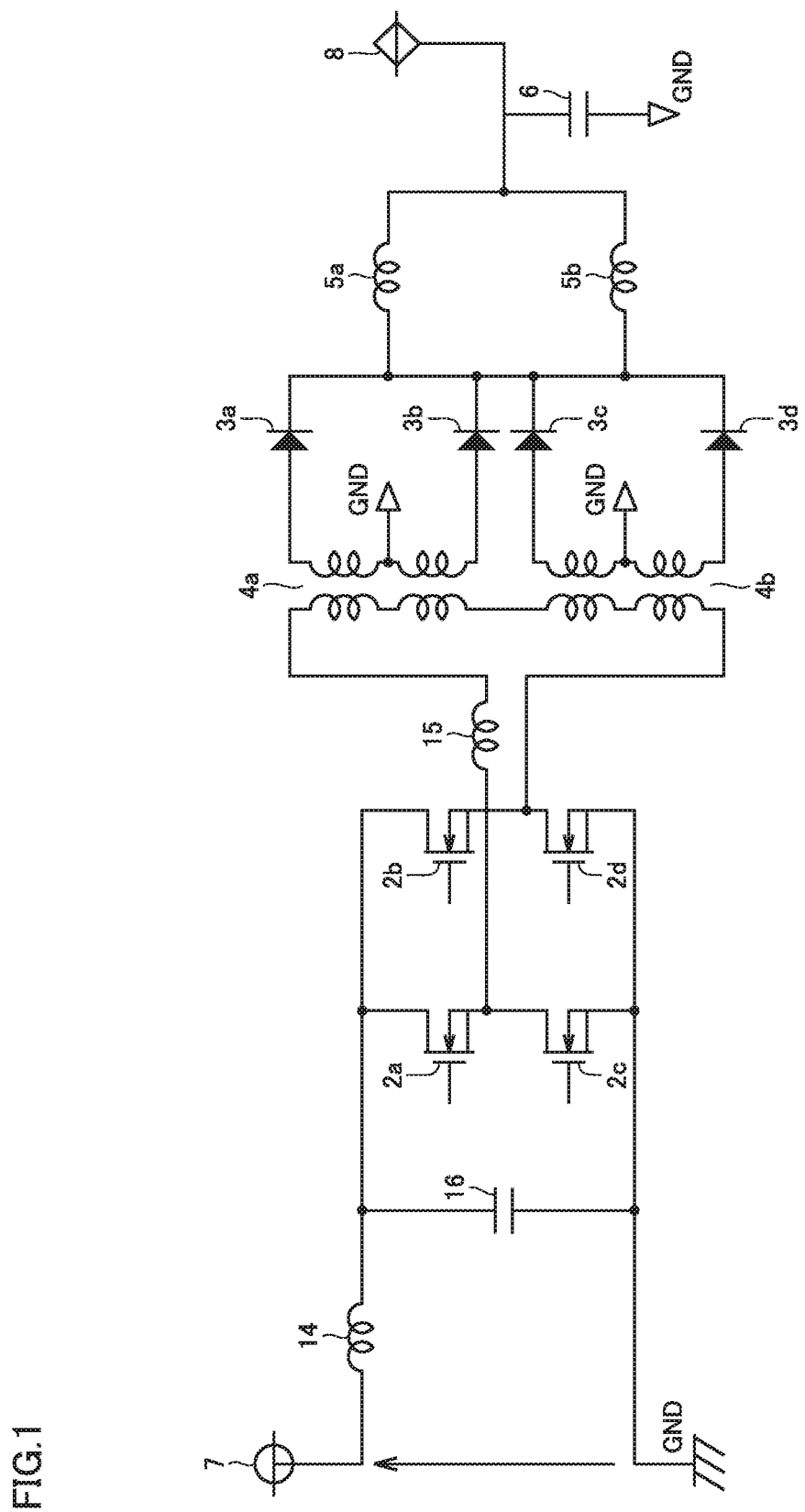
FIG. 1 is a circuit diagram of a power circuit device in accordance with a first embodiment of the present invention.

Hereinafter, embodiments of the present invention will be described with reference to the drawings, in which identical or corresponding parts will be designated by the same reference numerals, and the description thereof will not be repeated.

First Embodiment

<Circuit Configuration of Power Circuit Device>

FIG. 1 is a circuit diagram of a power circuit device in accordance with a first embodiment of the present invention. Referring to FIG. 1, a circuit configuration of the power circuit device in accordance with the present embodiment will be described.

As shown in FIG. 1, the power circuit device in accordance with the first embodiment of the present invention is a DC/DC converter, as an example.

In FIG. 1, a circuit of the DC/DC converter constituting the power circuit device mainly includes an inverter circuit and a rectification circuit. The inverter circuit includes primary-side switching elements 2a, 2b, 2c, 2d and transformers 4a, 4b. The rectification circuit includes secondary-side switching elements 3a, 3b, 3c, 3d. The DC/DC converter constituting the power circuit device further includes smoothing choke coils 5a, 5b, a smoothing capacitor 6, an input capacitor 16, a filter coil 15, and a resonance coil 14. An input terminal 7 to which a high-voltage direct current (DC) is input and an output terminal 8 which draws a flat DC voltage are each connected to the DC/DC converter. For output terminal 8, a screw terminal for mounting a printed substrate, or a terminal block can be used.

Resonance coil 14 and input capacitor 16 are arranged between input terminal 7 and the inverter circuit. In the inverter circuit, filter coil 15 is arranged between primary-side switching elements 2a, 2b, 2c, 2d and transformers 4a, 4b. Smoothing choke coils 5a, 5b and smoothing capacitor 6 are arranged between secondary-side switching elements 3a, 3b, 3c, 3d and output terminal 8.

Transformers 4a, 4b are constituted by magnetically connecting primary-side coil conductors (high voltage-side windings), which are connected to primary-side switching elements 2a, 2b, 2c, 2d, with secondary-side coil conductors (low voltage-side windings) by means of cores.

The power circuit device in the present embodiment converts, for example, a DC voltage of about 100 V to about 600 V input to input terminal 7 into a DC voltage of about 12 V to about 16 V, and outputs the DC voltage from output terminal 8. Specifically, a high DC voltage input to input terminal 7 is converted by the inverter circuit into a first alternating current (AC) voltage. The first AC voltage is converted by transformers 4a, 4b into a second AC voltage lower than the first AC voltage. The second AC voltage is rectified by the rectification circuit including secondary-side switching elements 3a, 3b, 3c, 3d. Smoothing choke coils 5a, 5b smooth the voltage output from the rectification circuit, and output a low DC voltage to the output terminal. Although two transformers 4a, 4b and two smoothing choke coils 5a, 5b are mounted in the present embodiment, the number thereof may be more than two. For example, the power circuit device may include three or more transformers. The power circuit device may include three or more smoothing choke coils.

<Configuration of Power Circuit Device>

Figure 2:
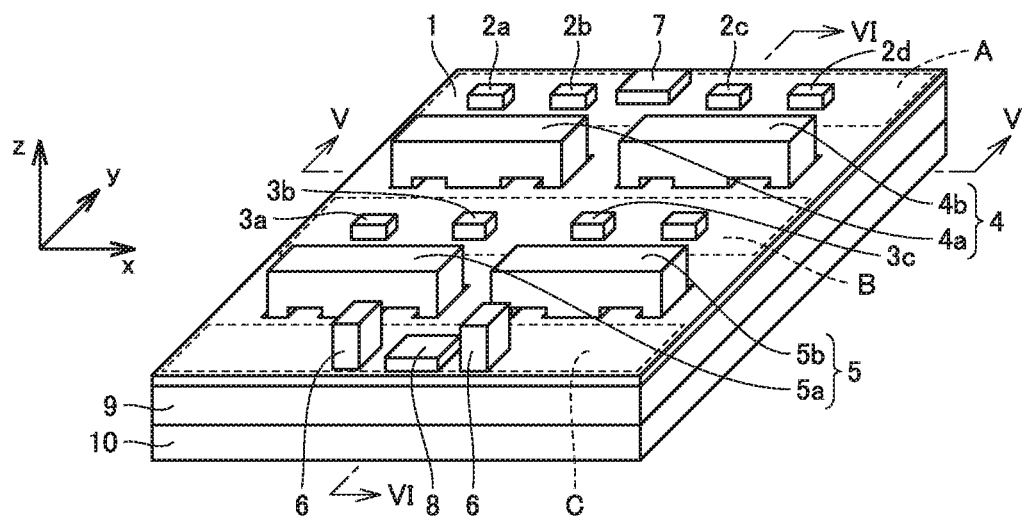
FIG. 2 is a schematic perspective view of the power circuit device in accordance with the first embodiment of the present invention.
Figure 3:
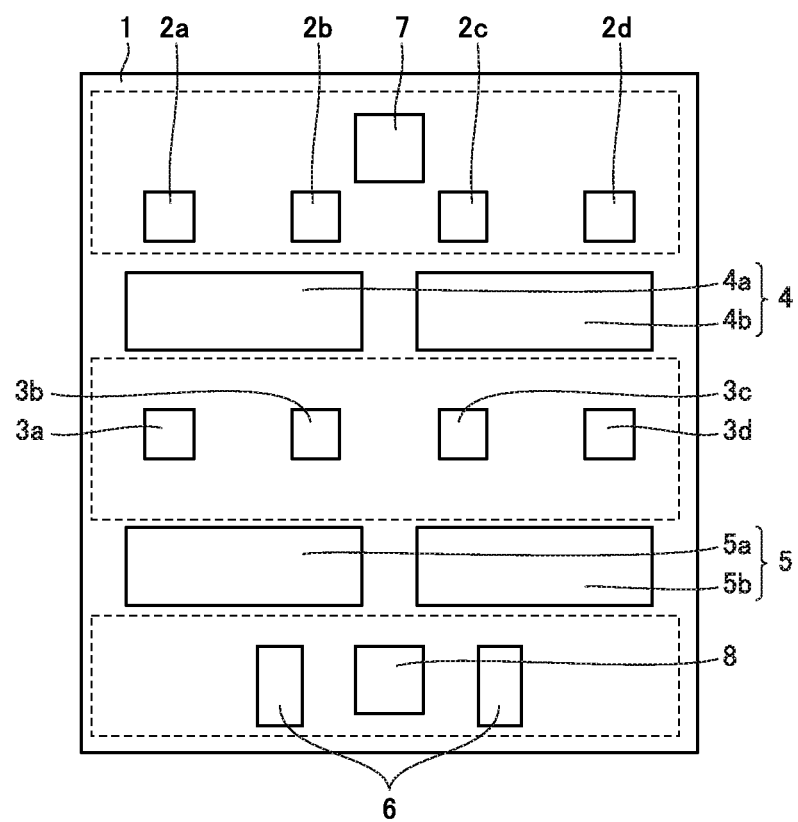
FIG. 3 is a schematic top view of the power circuit device in accordance with the first embodiment of the present invention.
Figure 4:
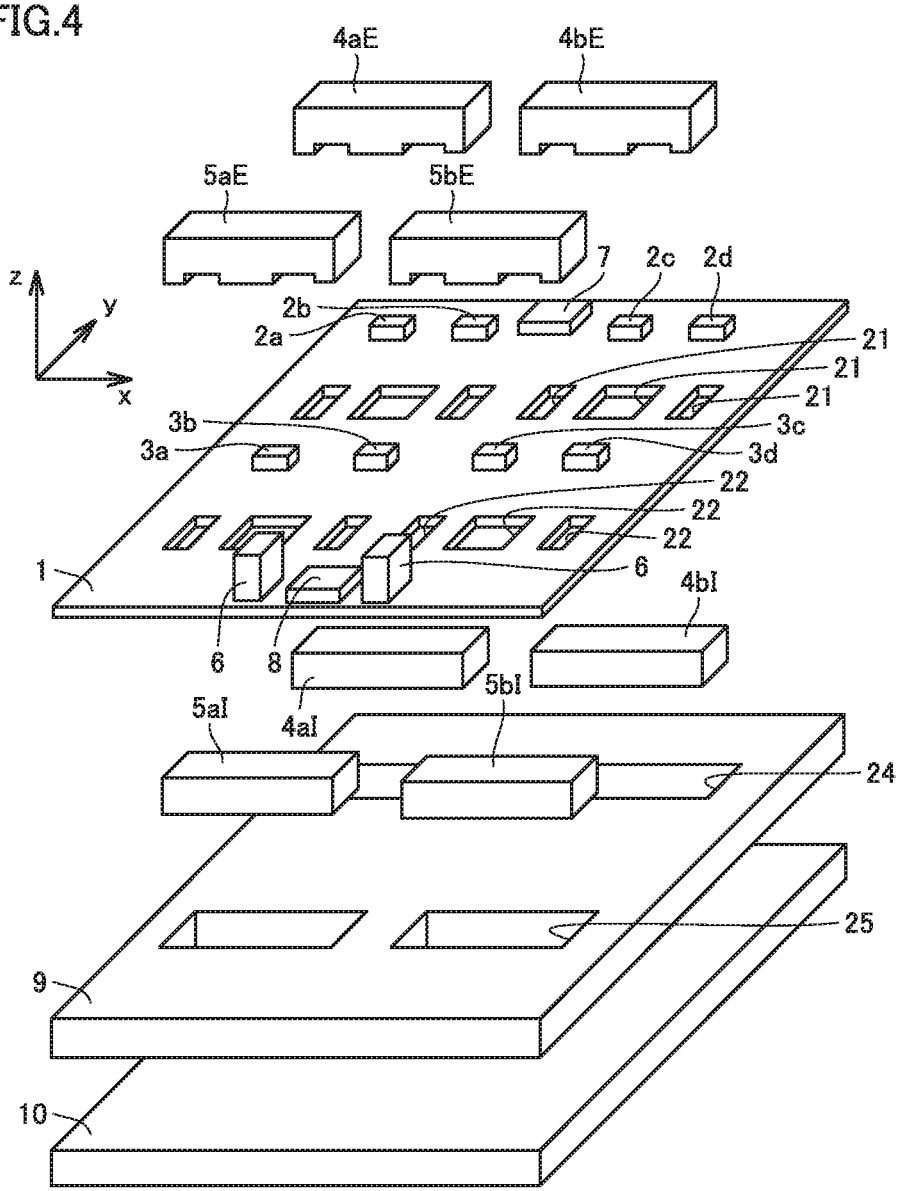
FIG. 4 is an exploded schematic perspective view of the power circuit device in accordance with the first embodiment of the present invention.
Figure 5:
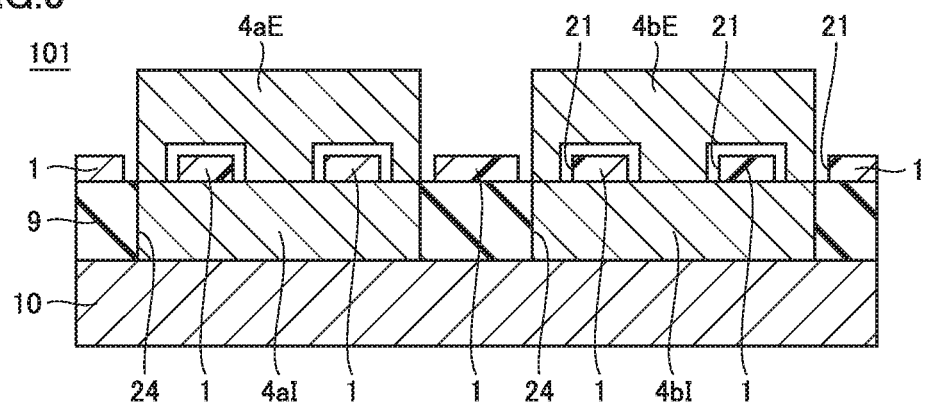
FIG. 5 is a schematic cross sectional view along a line segment V-V in FIG. 2.
Figure 6:
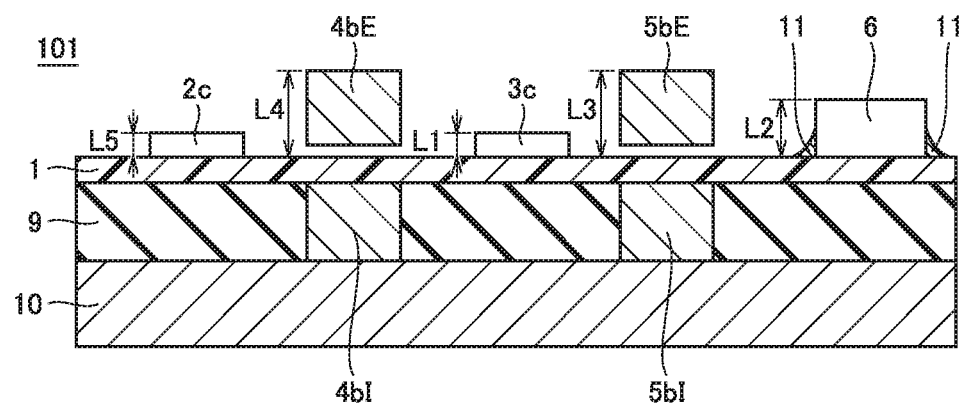
FIG. 6 is a schematic cross sectional view along a line segment VI-VI in FIG. 2.

FIG. 2 is a schematic perspective view of the power circuit device in accordance with the first embodiment of the present invention. FIG. 3 is a schematic top view of the power circuit device in accordance with the first embodiment of the present invention. FIG. 4 is an exploded schematic perspective view of the power circuit device in accordance with the first embodiment of the present invention. FIG. 5 is a schematic cross sectional view along a line segment V-V in FIG. 2. FIG. 6 is a schematic cross sectional view along a line segment VI-VI in FIG. 2. A configuration of the power circuit device in accordance with the present embodiment will be described with reference to FIGS. 2 to 6. In FIGS. 2 to 6, main components are shown, and wirings and some components are not shown.

FIG. 2 shows an appearance of a portion of or an entire DC/DC converter 101 as an example of the power circuit device in the present embodiment. That is, in a case where FIG. 2 shows a portion of DC/DC converter 101, FIG. 2 shows only a portion cut away from the entire DC/DC converter. In DC/DC converter 101, electric components such as primary-side switching elements 2a, 2b, 2c, 2d, a transformer 4 (transformers 4a, 4b), secondary-side switching elements 3a, 3b, 3c, 3d, a smoothing choke coil 5 (smoothing choke coils 5a, 5b), and smoothing capacitors 6 are connected to a printed substrate 1 serving as a circuit substrate. Printed substrate 1 is housed in a housing 10. Although the present embodiment shows an example in which resonance coil 14, filter coil 15, and input capacitor 16 shown in an electric circuit of FIG. 1 are not mounted on printed substrate 1 or housing 10, these electric components may be mounted on printed substrate 1. As shown in FIG. 2, in the present embodiment, a region in which input terminal 7 and primary-side switching elements 2a, 2b, 2c, 2d are mounted is referred to as a region A, a region in which secondary-side switching elements 3a, 3b, 3c, 3d are mounted is referred to as a region B, and a region in which smoothing capacitors 6 are mounted is referred to as a region C.

As shown in FIG. 2, the electric components to be mounted on printed substrate 1 are mainly arranged in an order according to the order in the electric circuit diagram shown in FIG. 1. Specifically, input terminal 7 is arranged in the vicinity of one side of printed substrate 1. Output terminal 8 is arranged in the vicinity of one side opposite to the one side adjacent to input terminal 7. Primary-side switching elements 2a, 2b, 2c, 2d are linearly arranged in a line along an X-axis direction in the vicinity of input terminal 7. Transformers 4a, 4b are arranged in a direction in which a longitudinal direction of transformer cores is substantially parallel to the line formed by primary-side switching elements 2a, 2b, 2c, 2d, that is, are arranged to be parallel to the X-axis direction. Secondary-side switching elements 3a, 3b, 3c, 3d are also linearly arranged in a line along the X-axis direction. Smoothing capacitors 6 are mounted at positions adjacent to output terminal 8.

Smoothing choke coils 5a, 5b are arranged between smoothing capacitors 6 and the line formed by secondary-side switching elements 3a, 3b, 3c, 3d mounted on printed substrate 1, in a direction in which a longitudinal direction of smoothing choke coil cores is substantially parallel to the line formed by secondary-side switching elements 3a, 3b, 3c, 3d, that is, are arranged to be parallel to the X-axis direction. Specifically, region C in which smoothing capacitors 6 are mounted and region B on printed substrate 1 in which secondary-side switching elements 3a, 3b, 3c, and 3d are mounted shown in FIG. 2 are separated by smoothing choke coils 5a, 5b.

From a different viewpoint, the power circuit device includes printed substrate 1 serving as a circuit substrate, a power circuit, and housing 10. The power circuit is formed on printed substrate 1. Housing 10 is connected with printed substrate 1. The power circuit includes electric elements (primary-side switching elements 2a, 2b, 2c, 2d, secondary-side switching elements 3a, 3b, 3c, 3d), at least one coil (smoothing choke coils 5a, 5b), and capacitors (smoothing capacitors 6). Portions of each smoothing choke coil core 5aE, 5aI, 5bE, 5bI serving as a core of smoothing choke coil 5a, 5b serving as the coil are inserted in opening portions 22 formed in printed substrate 1. Windings of smoothing choke coils 5a, 5b are formed on printed substrate 1. Smoothing choke coils 5a, 5b are located between region C serving as a first region in which smoothing capacitors 6 are arranged and regions A and B serving as a second region in which primary-side switching elements 2a, 2b, 2c, 2d and secondary-side switching elements 3a, 3b, 3c, 3d serving as the electric elements are arranged.

In addition, from a different viewpoint, smoothing choke coils 5a, 5b smooth a current flowing through the power circuit. Smoothing capacitors 6 smooth currents output from smoothing choke coils 5a, 5b. In the circuit substrate, smoothing choke coils 5a, 5b are arranged between smoothing capacitors 6 and the electric elements (primary-side switching elements 2a, 2b, 2c, 2d, secondary-side switching elements 3a, 3b, 3c, 3d). In printed substrate 1, at least one opening portion 22 is formed in a region between smoothing capacitors 6 and the electric elements. Smoothing choke coils 5a, 5b include cores (smoothing choke coil cores 5aE, 5aI, 5bE, 5bI), and windings surrounding the peripheries of the cores. Portions of each core (portions of smoothing choke coil core 5aE, 5bE) are inserted in opening portions 22 of printed substrate 1.

Although only one coil can constitute smoothing choke coil 5 in the power circuit device described above, two advantages described below are achieved by dividing smoothing choke coil 5 into two smoothing choke coils 5a, 5b. The first advantage is that, since the currents can flow in parallel, loss caused when the currents flow can be reduced in the windings. Since the temperature of printed substrate 1 can be thereby decreased, an increase in the temperature of smoothing capacitors 6 can be mitigated. The second advantage is that smoothing choke coil core 5aE, 5aI, 5bE, 5bI can have a reduced height and can be formed in a flat shape. Thereby, smoothing choke coils 5a, 5b arranged to be aligned can separate region B and region C.

When the above configuration is described from a different viewpoint, opening portions 22 formed in printed substrate 1 include first openings (some of a plurality of opening portions 22) and second openings (the others of the plurality of opening portions 22). Smoothing choke coil 5 includes smoothing choke coil 5a serving as a first coil and smoothing choke coil 5b serving a second coil. The cores include smoothing choke coil cores 5aE, 5aI serving as first coil cores and smoothing choke coil cores 5bE, 5bI serving as second coil cores, corresponding to the first coil and the second coil. Portions of smoothing choke coil core 5aE are inserted in some of the plurality of opening portions 22 serving as the first openings in printed substrate 1. Portions of smoothing choke coil core 5bE serving as a second coil core are inserted in the others of the plurality of opening portions 22 serving as the second openings in printed substrate 1. Smoothing choke coil core 5aE and smoothing choke coil core 5bE are arranged in a line when printed substrate 1 is viewed from a main surface. Smoothing choke coil cores 5aE, 5aI and smoothing choke coil cores 5bE, 5bI are arranged to traverse between region C and regions A and B.

In addition, from a different viewpoint, in the power circuit device described above, smoothing choke coil 5 includes the first coil (smoothing choke coil 5a) and the second coil (smoothing choke coil 5b). Opening portions 22 formed in printed substrate 1 include the first openings (opening portions 22 located in a region overlapping with smoothing choke coil 5a) and the second openings (opening portions 22 located in a region overlapping with smoothing choke coil 5b). Portions of the core of the first coil (smoothing choke coil 5a) (i.e., portions of smoothing choke coil core 5aE) are inserted in the first openings (opening portions 22) in printed substrate 1. Portions of the core of the second coil (smoothing choke coil 5b) (i.e., portions of smoothing choke coil core 5bE) are inserted in the second openings (opening portions 22) in printed substrate 1.

Regions surrounded by dotted lines in FIGS. 2 and 3 represent region A, region B, and region C, respectively. In region A, primary-side switching elements 2a, 2b, 2c, 2d and input terminal 7 are arranged. In region B, secondary-side switching elements 3a, 3b, 3c, 3d are arranged. In region C, smoothing capacitors 6 and output terminal 8 are mounted.

Transformer 4 is arranged between region A and region B. Specifically, opening portions 21 are provided in a region between region A and region B in printed substrate 1, and transformer cores 4aE, 4bE are fitted into opening portions 21. Transformer cores 4aE, 4bE are arranged in the direction in which the longitudinal direction of transformer cores 4aE, 4bE is parallel to the line formed by a plurality of primary-side switching elements 2a, 2b, 2c, 2d. Conversely, region A and region B are separated by transformer 4.

In addition, smoothing choke coil 5 is arranged between region B and region C. Specifically, opening portions 22 are provided in a region between region B and region C in printed substrate 1, and smoothing choke coil cores 5aE, 5bE are fitted into opening portions 22. Smoothing choke coil cores 5aE, 5bE are arranged in the direction in which the longitudinal direction of smoothing choke coil cores 5aE, 5bE is parallel to the line formed by a plurality of secondary-side switching elements 3a, 3b, 3c, 3d. Conversely, region B and region C are separated by smoothing choke coil 5. In addition, when viewed from region C, region C is separated from region A by smoothing choke coil 5, region B, and transformer 4.

In the power circuit device shown in FIG. 2, an assembly process can be simplified because all of the electric components can be mounted on printed substrate 1. Specifically, primary-side switching elements 2a, 2b, 2c, 2d, secondary-side switching elements 3a, 3b, 3c, 3d, and smoothing capacitors 6 can be collectively fixed to printed substrate 1 by a reflow soldering method, for example. Further, by forming windings beforehand on printed substrate 1 using a wiring pattern, transformers 4a, 4b and smoothing choke coils 5a, 5b function merely by attaching cores on printed substrate 1. Accordingly, the power circuit device shown in FIG. 2 is assembled extremely easily.

In a conventional power circuit device, a separate component formed by assembling a core and a wiring is mounted as each of a transformer and a smoothing choke coil. However, in the present embodiment, since the windings are formed using the wiring pattern of printed substrate 1, the transformers and the smoothing choke coils can be formed merely by placing the cores on printed substrate 1. Further, since the windings formed on a front surface of printed substrate 1 using the wiring pattern are formed simultaneously with formation of another wiring pattern, the manufacturing cost for the windings can be reduced as a result, when compared with a conventional case where the transformer and the like are mounted as separate components. Thereby, DC/DC converter 101 can be manufactured at a lower cost than that of the conventional power circuit device.

Housing 10 is a member in the shape of a rectangular flat plate made of a metal material having a good heat conductivity. Specifically, housing 10 is preferably composed of aluminum, for example. Housing 10 may be composed of another material such as copper, an aluminum alloy, or a magnesium alloy. Housing 10 may be formed in a box shape to cover printed substrate 1, as described later. An insulating member 9 is arranged above housing 10. Insulating member 9 connects housing 10 and printed substrate 1. That is, housing 10 is thermally connected with printed substrate 1 through insulating member 9. Housing 10 is set at a GND potential on the secondary side of the circuit shown in FIG. 1. Housing 10 is electrically connected with the wiring pattern having the GND potential of printed substrate 1 through fastening members 12 (see FIG. 8). In the present embodiment, housing 10 does not have to be a completely flat plate, and asperities may be formed in order to secure an electric insulation distance from printed substrate 1.

Insulating member 9 is preferably composed of a material having electric insulation property and having a good heat conductivity. For example, a member formed by dispersing particles of an insulator having heat conductivity in a resin can be used as insulating member 9. Specifically, a sheet formed by mixing particles of aluminum oxide, aluminum nitride, or the like for improving heat conductivity into a silicone resin can be used as insulating member 9. Aluminum oxide or aluminum nitride has a good heat conductivity and has electric insulation property. It should be noted that, instead of the sheet described above, a grease or an adhesive may be used as insulating member 9.

Referring to FIGS. 4 and 5, transformers 4a, 4b mounted in DC/DC converter 101 include transformer cores 4aE, 4aI, 4bE, 4bI, and windings (not shown) made of the wiring pattern formed on printed substrate 1.

Transformer core 4aE, 4aI, 4bE, 4bI may include, for example, a ferrite core made of a Mn—Zn ferrite, a Ni—Zn ferrite, or the like, an amorphous core, or an iron dust core. As shown in FIG. 4, I-shaped transformer cores 4aI, 4bI are arranged on a back surface side of printed substrate 1. I-shaped transformer cores 4aI, 4bI are arranged inside opening portions 24 formed in insulating member 9. As shown in FIG. 5, lower surfaces of I-shaped transformer cores 4aI, 4bI are in contact with a front surface of housing 10. In addition, E-shaped transformer cores 4aE, 4bE are fitted into opening portions 21 provided in printed substrate 1, from a front surface side of printed substrate 1, and are arranged to come into contact with front surfaces of I-shaped transformer cores 4aI, 4bI. On this occasion, it is preferable to press E-shaped transformer cores 4aE, 4bE toward housing 10 by means of springs or the like in order to reduce contact heat resistance between E-shaped transformer cores 4aE, 4bE and I-shaped transformer cores 4aI, 4bI. It should be noted that, although E-shaped transformer cores 4aE, 4bE are fitted from the front surface of printed substrate 1 in the present embodiment, E-shaped transformer cores 4aE, 4bE may be fitted from the back side of printed substrate 1.

Transformer cores 4aE, 4aI, 4bE, 4bI generate heat due to a periodic change in magnetic flux. In particular, since a change in magnetic flux may occur in a frequency in the kHz range when DC/DC converter 101 is driven, transformer cores 4aE, 4aI, 4bE, and 4bI generate an extremely large amount of heat. In the present embodiment, since the transformer constituting the inverter circuit is constituted of two transformers 4a and 4b, a height from the front surface of printed substrate 1 to a top of each transformer can be reduced, and the size of the transformers in a planar direction can be increased, when compared with a case where the transformer is constituted of one transformer. Thereby, the contact area between I-shaped transformer cores 4aI, 4bI and housing 10 is increased. As a result, the heat generated by transformer cores 4aE, 4aI, 4bE, 4bI can be efficiently dissipated to housing 10.

Further, referring to FIGS. 4 and 6, smoothing choke coils 5a, 5b mounted in DC/DC converter 101 include smoothing choke coil cores 5aE, 5aI, 5bE, 5bI, and windings (not shown) made of the wiring pattern formed on printed substrate 1. Smoothing choke coil core 5aE, 5aI, 5bE, 5bI includes, for example, a ferrite core made of a Mn—Zn ferrite, a Ni—Zn ferrite, or the like, an amorphous core, or an iron dust core. I-shaped smoothing choke coil cores 5aI, 5bI are arranged on the back surface side of printed substrate 1. I-shaped smoothing choke coil cores 5aI, 5bI are arranged inside opening portions 25 formed in insulating member 9. Lower surfaces of I-shaped smoothing choke coil cores 5aI, 5bI are in contact with the front surface of housing 10. In addition, E-shaped smoothing choke coil cores 5aE, 5bE are fitted into opening portions 22 provided in printed substrate 1, from the front surface side of printed substrate 1, and are arranged to come into contact with front surfaces of I-shaped smoothing choke coil cores 5aI, 5bI. On this occasion, E-shaped smoothing choke coil cores 5aE, 5bE may be pressed toward housing 10 by means of pressing members such as springs or the like in order to increase a magnetic coupling strength between the E-shaped smoothing choke coil cores and the I-shaped smoothing choke coil cores. It should be noted that, although E-shaped smoothing choke coil cores 5aE, 5bE are fitted from the front surface of printed substrate 1 in the present embodiment, E-shaped smoothing choke coil cores 5aE, 5bE may be fitted from the back side thereof.

Since the amount of heat generated by smoothing choke coil cores 5aE, 5bE, 5bI is smaller than that generated by transformer cores 4aE, 4aI, 4bE, 4bI, the air surrounding smoothing choke coil cores 5aE, 5aI, 5bE, 5bI has a lower temperature as a result. In the present embodiment, since the smoothing choke coil is constituted of two smoothing choke coils 5a and 5b, a height from the front surface of printed substrate 1 to a top of each smoothing choke coil can be reduced, and the size of the smoothing choke coils in the planar direction can be increased, when compared with a case where the smoothing choke coil is constituted of one smoothing choke coil. Although a structure constituted of transformer cores 4aE and 4aI, a structure constituted of transformer cores 4bE and 4bI, a structure constituted of smoothing choke coil cores 5aE and 5aI, and a structure constituted of smoothing choke coil cores 5bE and 5bI have an equal size in the present embodiment, the size of the transformer cores may be different from the size of the smoothing choke coil cores.

Smoothing capacitor 6 may include, for example, a ceramic capacitor, a film capacitor, or an electrolytic capacitor. Smoothing capacitors 6 are mounted on printed substrate 1 by means of a bonding member 11. Although solder is preferably used as bonding member 11, for example, a material having a good heat conductivity other than solder, such as an electrically conductive adhesive or a nano-silver paste, may be used as bonding member 11.

The amount of heat generated by smoothing capacitors 6 is smaller than those generated by switching elements 2a to 2d, 3a to 3d, the wiring pattern, transformer cores 4aE, 4aI, 4bE, 4bI, and the like. However, smoothing capacitors 6 may receive heat from the switching elements and the like described above through the wiring pattern or the air, and may cause an increase in temperature. In the present embodiment, by arranging fastening members 12 (see FIG. 8) in the vicinity of smoothing capacitors 6, a heat dissipation path for smoothing capacitors 6 can be secured, and the increase in the temperature of smoothing capacitors 6 can be mitigated.

Figure 9:
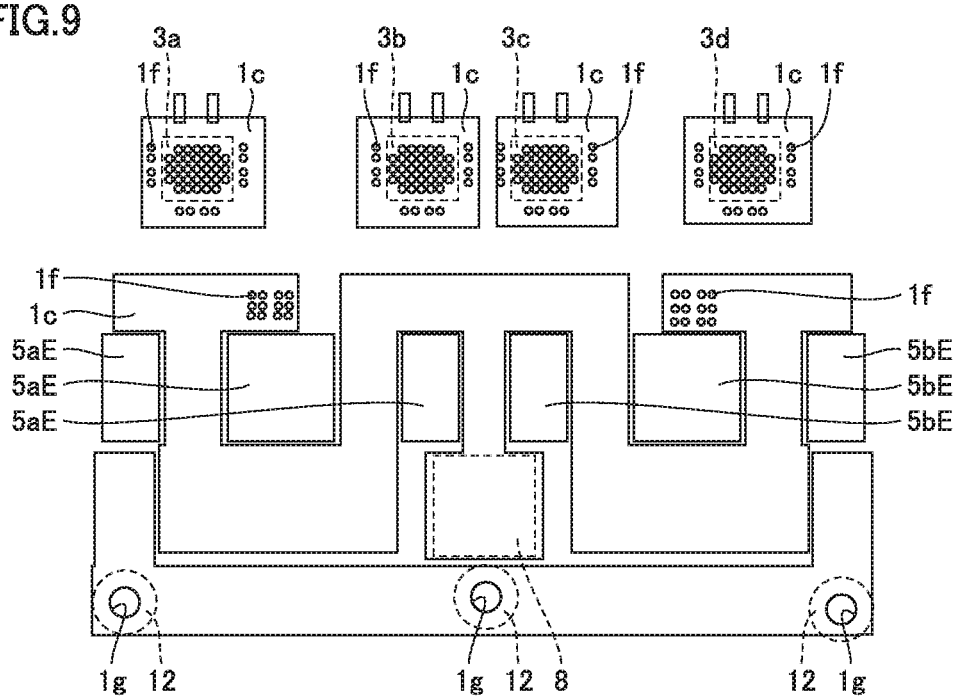
FIG. 9 is a partial schematic plan view of a second-layer wiring pattern of the printed substrate of the power circuit device shown in FIG. 2.
Figure 10:
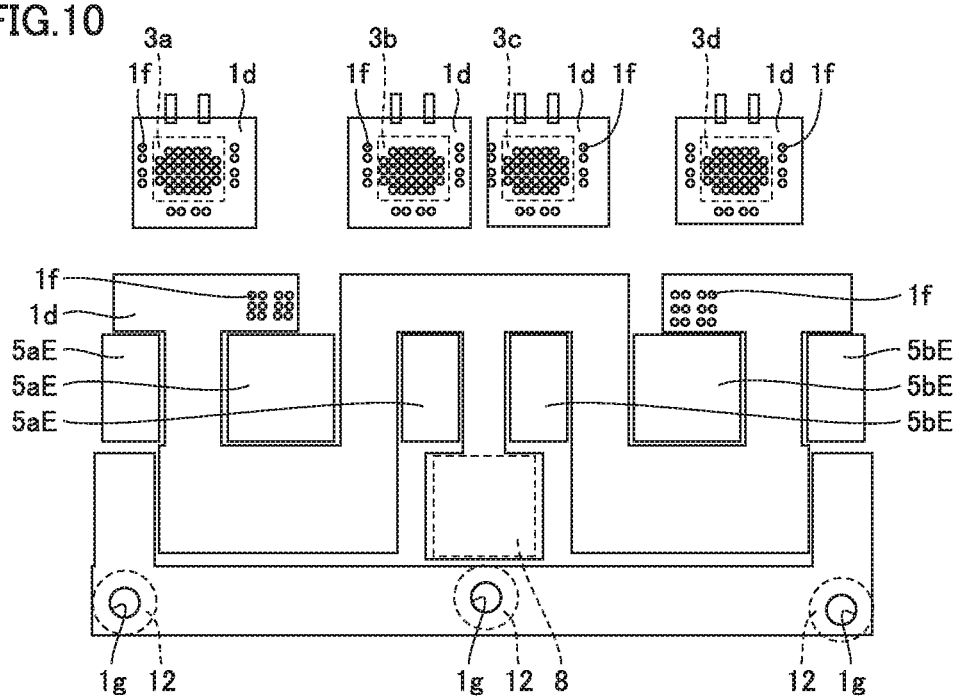
FIG. 10 is a partial schematic plan view of a third-layer wiring pattern of the printed substrate of the power circuit device shown in FIG. 2.
Figure 11:
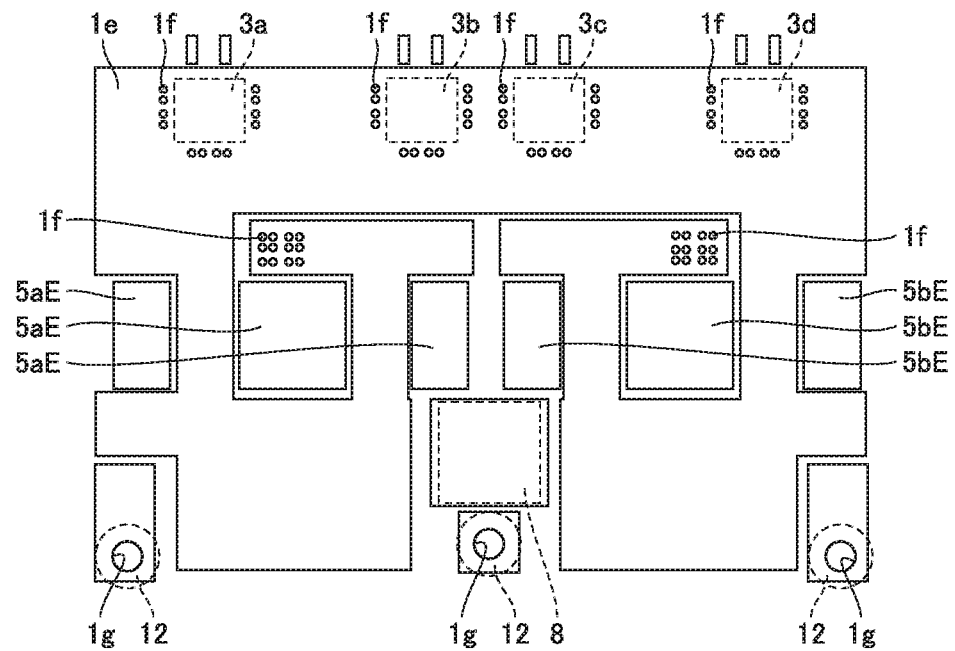
FIG. 11 is a partial schematic plan view of a fourth-layer wiring pattern of the printed substrate of the power circuit device shown in FIG. 2.

FIG. 7 is a partial schematic cross sectional view of printed substrate 1 serving as the circuit substrate of the power circuit device shown in FIG. 2. FIG. 8 is a partial schematic top view of the printed substrate of the power circuit device shown in FIG. 2. FIGS. 9 to 11 are partial schematic plan views of a second-layer wiring pattern to a fourth-layer wiring pattern of the printed substrate of the power circuit device shown in FIG. 2. A configuration of printed substrate 1 will be described with reference to FIGS. 7 to 11.

FIG. 7 shows a partial schematic cross sectional view of wiring layers in a region for mounting secondary-side switching elements 3a, 3b, 3c, 3d, smoothing choke coils 5a, 5b, and smoothing capacitors 6, of printed substrate 1 used for the power circuit device shown in FIGS. 1 to 6. FIGS. 8 to 11 show planar patterns in the respective layers, that is, a first-layer wiring pattern 1b to a fourth-layer wiring pattern 1e, in the region for mounting secondary-side switching elements 3a, 3b, 3c, 3d, smoothing choke coils 5a, 5b, and smoothing capacitors 6, in printed substrate 1. Printed substrate 1, which is a constituent of DC/DC converter 101, includes a four-layer wiring pattern.

As shown in FIG. 7, printed substrate 1 includes insulating layers 1a, and first-layer wiring pattern 1b, a second-layer wiring pattern 1c, a third-layer wiring pattern 1d, and fourth-layer wiring pattern 1e. Insulating layers 1a are formed between these wiring patterns. Insulating layer 1a is preferably composed of glass fibers and an epoxy resin, for example. It should be noted that the composition of insulating layer 1a is not limited to the composition described above, and insulating layer 1a may be composed of an aramid resin and an epoxy resin, for example. In addition, a so-called metal substrate or ceramic substrate may be used as printed substrate 1. Although first-layer wiring pattern 1b, second-layer wiring pattern 1c, third-layer wiring pattern 1d, and fourth-layer wiring pattern 1e are composed of copper, they may be composed of another material. For example, first-layer wiring pattern 1b to fourth-layer wiring pattern 1e may be formed of an electrically conductive material, for example, a metal such as gold (Au), a copper (Cu) alloy, a nickel (Ni) alloy, a gold (Au) alloy, a silver (Ag) alloy, or the like.

A large current of 100 A or more at maximum may flow through first-layer wiring pattern 1b to fourth-layer wiring pattern 1e. In this case, loss is caused in the wiring patterns described above, resulting in extremely large heat generation. As shown in FIGS. 8 to 11, in printed substrate 1, heat generated in first-layer wiring pattern 1b to fourth-layer wiring pattern 1e is transferred to housing 10, through heat dissipation vias 1f penetrating the wiring patterns from the front surface to the back surface of printed substrate 1, and fastening members 12 fastening printed substrate 1 and housing 10 and penetrating the wiring patterns. As a result, an increase in the temperature of the wiring patterns can be mitigated. In addition, not only heat is generated in the wiring patterns, but also heat generated by secondary-side switching elements 3a, 3b, 3c, 3d is conducted to the wiring patterns. Accordingly, heat dissipation vias 1f and fastening members 12 also contribute to heat dissipation of secondary-side switching elements 3a, 3b, 3c, 3d.

In the present embodiment, the thickness from first-layer wiring pattern 1b to fourth-layer wiring pattern 1e is set to about 100 μm. As a result, electric resistance is reduced by about 70% in the wiring pattern of the power circuit device in accordance with the present embodiment, when compared with a 35 μm-thick wiring pattern which has been commonly used. Accordingly, the amount of heat generation can be reduced by 70% in first-layer wiring pattern 1b to fourth-layer wiring pattern 1e, when compared with the conventional 35 μm-thick wiring pattern. Further, by setting the thickness of the wiring pattern to 100 μm, heat resistance in the planar direction of printed substrate 1 can be reduced by 70%. As a result, in each of first-layer wiring pattern 1b to fourth-layer wiring pattern 1e shown in FIGS. 8 to 11, heat can be efficiently transferred to heat dissipation vias 1f and fastening members 12 serving as cooling points, as indicated by arrows 41 in FIG. 8, for example. Thereby, an increase in the temperature of the front surface of printed substrate 1 can be suppressed, and the temperature around printed substrate 1 can be decreased as a result. That is, the increase in the temperature of heat-sensitive smoothing capacitors 6 can be suppressed.

Figure 12:
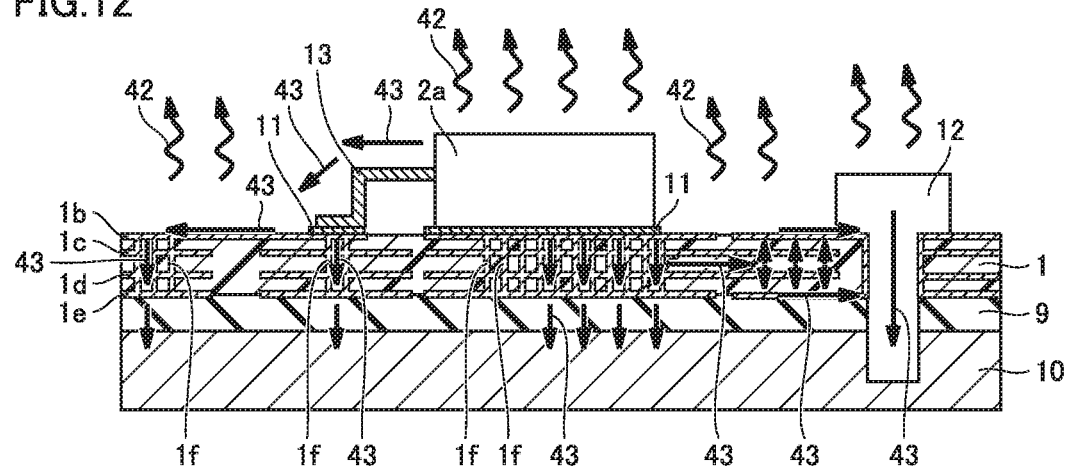
FIG. 12 is a partial schematic cross sectional view of the power circuit device in accordance with the first embodiment of the present invention.

FIG. 12 is a partial schematic cross sectional view of the power circuit device in accordance with the first embodiment of the present invention. FIG. 12 is a schematic view for illustrating a heat dissipation path from a switching element having a large amount of heat generation, used in the power circuit device in accordance with the first embodiment of the present invention. It should be noted that, although FIG. 12 shows primary-side switching element 2a as an exemplary switching element, secondary-side switching element 3a, 3b, 3c, 3d also has the same heat dissipation path.

Primary-side switching elements 2a, 2b, 2c, 2d and secondary-side switching elements 3a, 3b, 3c, 3d are each a package having a semiconductor chip sealed with a resin. As the semiconductor chip, for example, a MOSFET (Metal Oxide Semiconductor Field Effect Transistor), an IGBT (Insulated Gate Bipolar Transistor), or the like can be used. These semiconductor chips have an extremely large amount of heat generation. In addition, silicon (Si), silicon carbide (SiC), gallium nitride (GaN), or the like may be used for the semiconductor chip embedded in each of primary-side switching elements 2a, 2b, 2c, 2d and secondary-side switching elements 3a, 3b, 3c, 3d. Primary-side switching elements 2a, 2b, 2c, 2d and secondary-side switching elements 3a, 3b, 3c, 3d are fixed to the front surface of printed substrate 1 by means of bonding member 11. Solder is preferably used as bonding member 11, for example. It should be noted that a material having a good heat conductivity other than solder, such as an electrically conductive adhesive or a nano-silver paste, for example, may be used as bonding member 11.

In printed substrate 1, a plurality of heat dissipation vias 1f penetrating printed substrate 1 to extend from one main surface of printed substrate 1 to reach the other main surface thereof are formed. As also shown in FIGS. 8 to 11, the plurality of heat dissipation vias 1f are arranged immediately below primary-side switching element 2a, 2b, 2c, 2d or secondary-side switching element 3a, 3b, 3c, 3d and around the periphery thereof. It should be noted that the positions for arranging vias 1f are not limited to the positions shown in FIGS. 8 to 11. In addition, heat dissipation via 1f is also arranged at a position for establishing electrical conduction between at least two of first-layer wiring pattern 1b, second-layer wiring pattern 1c, third-layer wiring pattern 1d, and fourth-layer wiring pattern 1e, in order to constitute an electric circuit. Heat dissipation via 1f may have any planar shape, and may have a circular shape, for example. Preferably, the same material as that for the wiring patterns is plated inside heat dissipation via 1f. In this case, a plating layer inside heat dissipation via 1f is thermally connected with the wiring patterns. Therefore, heat can be efficiently diffused from the front surface to the back surface of printed substrate 1, through heat dissipation vias 1f.

In the power circuit device in the present embodiment, heat generated by each of primary-side switching elements 2a, 2b, 2c, 2d and secondary-side switching elements 3a, 3b, 3c, 3d is eventually transferred to housing 10, and is dissipated to the outside through housing 10. In this case, a heat dissipation path to housing 10 can be classified into first to fifth heat dissipation paths described below.

As the first heat dissipation path, a path as described below is conceivable. Specifically, the heat generated by each of primary-side switching elements 2a, 2b, 2c, 2d and secondary-side switching elements 3a, 3b, 3c, 3d is transferred, through bonding member 11 immediately below each switching element, to heat dissipation vias 1f formed in a region below each switching element on printed substrate 1, and in a region around the periphery thereof, as indicated by arrows 43. The heat transferred to heat dissipation vias 1f is conducted through heat dissipation vias 1f, further conducted to insulating member 9, and eventually conducted to housing 10.

As the second heat dissipation path, a path as described below is conceivable. Specifically, the heat generated by each of primary-side switching elements 2a, 2b, 2c, 2d and secondary-side switching elements 3a, 3b, 3c, 3d is conducted to a lead 13 provided to each of primary-side switching elements 2a, 2b, 2c, 2d and secondary-side switching elements 3a, 3b, 3c, 3d. This heat is transferred to heat dissipation vias 1f through lead 13 and first-layer wiring pattern 1b. Then, the heat is conducted to housing 10 through heat dissipation vias 1f and insulating member 9, as with the first heat dissipation path.

As the third heat dissipation path, a path as described below is conceivable. Specifically, the heat generated by each of primary-side switching elements 2a, 2b, 2c, 2d and secondary-side switching elements 3a, 3b, 3c, 3d is conducted through bonding member 11 to heat dissipation vias 1f immediately below each switching element. After passing through heat dissipation vias 1f, the heat is diffused in second-layer wiring pattern 1c and third-layer wiring pattern 1d, in the planar direction of printed substrate 1. Further, the heat is transferred to first-layer wiring pattern 1b, through insulating layer 1a located between second-layer wiring pattern 1c and first-layer wiring pattern 1b. In addition, the heat is transferred to fourth-layer wiring pattern 1e, through insulating layer 1a located between third-layer wiring pattern 1d and fourth-layer wiring pattern 1e. Then, the heat is transferred to fastening member 12 electrically connected to first-layer wiring pattern 1b and fourth-layer wiring pattern 1e. The heat is dissipated to housing 10 through fastening member 12. On this occasion, first-layer wiring pattern 1b and fourth-layer wiring pattern 1e establishing electrical conduction with fastening member 12 are electrically insulated from second-layer wiring pattern 1c and third-layer wiring pattern 1d establishing electrical conduction with primary-side switching element 2a, 2b, 2c, 2d or secondary-side switching element 3a, 3b, 3c, 3d. Regarding the third heat dissipation path, the relation between a pair of first-layer wiring pattern 1b and fourth-layer wiring pattern 1e and a pair of second-layer wiring pattern 1c and third-layer wiring pattern 1d may be reversed. That is, the heat may be conducted in first-layer wiring pattern 1b and fourth-layer wiring pattern 1e, in the planar direction of printed substrate 1, and then the heat may be transferred to fastening member 12 through second-layer wiring pattern 1c and third-layer wiring pattern 1d.

As the fourth heat dissipation path, a path as described below is conceivable. Specifically, the heat generated by each of primary-side switching elements 2a, 2b, 2c, 2d and secondary-side switching elements 3a, 3b, 3c, 3d is conducted through wiring patterns 1b, 1c, 1d, 1e. The heat is conducted to an electric component thermally connected with wiring patterns 1b, 1c, 1d, 1e. Then, the heat is diffused from the electric component to housing 10 through heat dissipation vias 1f and insulating member 9. The "electric component thermally connected with wiring patterns 1b, 1c, 1d, 1e" used herein does not have to be electrically connected with wiring patterns 1b, 1c, 1d, 1e, and also includes an electric component adjacent to wiring patterns 1b, 1c, 1d, 1e. Smoothing capacitor 6 is an example of such an electric component.

As the fifth heat dissipation path, a path as described below is conceivable. Specifically, the fifth heat dissipation path is a path through which the heat generated by each of primary-side switching elements 2a, 2b, 2c, 2d and secondary-side switching elements 3a, 3b, 3c, 3d is directly thermally transferred to the air and dissipated, as indicated by arrows 42 in FIG. 12. In this case, the temperature of the air around printed substrate 1 is increased by the heat dissipated to the air. Then, with an increase in the temperature of the air, convection of the air within housing 10 occurs. Thereby, when the air having an increased temperature comes into contact with a component having a temperature lower than that of the air within housing 10, for example, smoothing capacitor 6, heat is transferred from the air to smoothing capacitor 6. Then, the heat is eventually dissipated to housing 10.

In addition, although a space above printed substrate 1 is filled with the air in the present embodiment, the space may be filled with a resin material composed by containing a thermally conductive filler in an epoxy resin, a silicone resin, or the like. In this case, the heat generated by each switching element is conducted to a solid resin material, conducted to smoothing capacitor 6, and eventually dissipated to housing 10. It should be noted that the resin material is not limited to a solid but may also be a liquid.

<Function/Effect of Power Circuit Device>

As can be seen from FIGS. 2 to 6, by arranging two smoothing choke coils 5a, 5b in the X-axis direction, opening portions 22 for fitting E-shaped smoothing choke coil cores 5aE, 5bE into printed substrate 1 can be provided between secondary-side switching elements 3a, 3b, 3c, 3d and smoothing capacitors 6. Due to the presence of opening portions 22, the cross sectional area of printed substrate 1 in a ZX plane view between region B and region C shown in FIG. 2 can be reduced to about 30 percent of those of other regions. Thereby, the amount of heat flowing from region B into region C through printed substrate 1 can be reduced. That is, since the area of wiring patterns 1b, 1c, 1d, 1e and insulating layers 1a can be reduced as a result in a region between region B and region C (i.e., in a region in which smoothing choke coils 5a, 5b are formed), heat resistance in the fourth heat dissipation path described above in the region can be increased. Thus, the amount of heat flowing into smoothing capacitors 6 is reduced, and thereby the increase in the temperature of smoothing capacitors 6 can be mitigated.

Further, in addition to separation between region B and region C by E-shaped smoothing choke coil cores 5aE, 5bE, as shown in the schematic cross sectional view of FIG. 6, tops of secondary-side switching element 3a, 3b, 3c, 3d and smoothing capacitor 6 are at positions lower than a top of E-shaped smoothing choke coil core 5aE, 5bE in a thickness direction (that is, a Z direction) of printed substrate 1. From a different viewpoint, of a first height L1 from the front surface of printed substrate 1 serving as the circuit substrate to the top of secondary-side switching element 3a, 3b, 3c, 3d serving as the electric element, a second height L2 from the front surface of printed substrate 1 to the top of smoothing capacitor 6, and a third height L3 from the front surface of printed substrate 1 to the top of E-shaped smoothing choke coil core 5aE, 5bE, third height L3 is highest. Accordingly, even when a space above region B is filled with the air surrounding secondary-side switching elements 3a, 3b, 3c, 3d which is heated by high-temperature secondary-side switching elements 3a, 3b, 3c, 3d, the amount of the heated air flowing from the space above region B into a space above region C is extremely small due to the presence of smoothing choke coil cores 5aE, 5bE. That is, the fifth heat dissipation path described above can be blocked by smoothing choke coil cores 5aE, 5bE. Accordingly, the increase in the temperature of smoothing capacitors 6 can be mitigated. Thereby, the probability that smoothing capacitors 6 may be broken by the increase in the temperature of smoothing capacitors 6 can be reduced, and thus the reliability of the power circuit device can be significantly improved.

Further, when the temperature of primary-side switching elements 2a, 2b, 2c, 2d is higher than the temperature of secondary-side switching elements 3a, 3b, 3c, 3d, it is preferable to provide opening portions 21 for fitting E-shaped transformer cores 4aE, 4bE into printed substrate 1 between primary-side switching elements 2a, 2b, 2c, 2d and secondary-side switching elements 3a, 3b, 3c, 3d, and constitute transformers 4a, 4b by arranging two transformers 4a, 4b in the X-axis direction, as can be seen from FIGS. 2 to 6.

From a different viewpoint, in the power circuit device described above, the electric elements include first elements (primary-side switching elements 2a, 2b, 2c, 2d) and second elements (secondary-side switching elements 3a, 3b, 3c, 3d). The power circuit includes at least one transformer 4. Transformer 4 has transformer cores 4aE, 4aI, 4bE, 4bI, and windings surrounding the peripheries of the transformer cores. At least one transformer opening portion (opening portion 21) is formed in a region between the first elements (primary-side switching elements 2a, 2b, 2c, 2d) and the second elements (secondary-side switching elements 3a, 3b, 3c, 3d) in printed substrate 1. Portions of transformer core 4aE, 4bE are inserted in opening portions 21 of printed substrate 1.

In addition, transformer 4 includes a first transformer (transformer 4a) and a second transformer (transformer 4b). The transformer opening portions (opening portions 21) formed in printed substrate 1 include first transformer openings (opening portions 21 formed at positions overlapping with transformer 4a) and second transformer openings (opening portions 21 formed at positions overlapping with transformer 4b). Portions of transformer core 4aE of transformer 4a are inserted in the first transformer openings of printed substrate 1. Portions of transformer core 4bE of transformer 4b are inserted in the second transformer openings of printed substrate 1.

In addition, as shown in FIG. 6, of a fourth height (a height L5) from the front surface of printed substrate 1 to a top of the first element (primary-side switching element 2a, 2b, 2c, 2d), a fifth height (height L1) from the front surface of printed substrate 1 to a top of the second element (secondary-side switching element 3a, 3b, 3c, 3d), and a sixth height (a height L4) from the front surface of printed substrate 1 to a top of transformer core 4aE, 4bE, the sixth height (height L4) is highest.

Since heat transfer from region A to region B through printed substrate 1 and the space described above can be thereby limited, the temperature of region B can be decreased. That is, the temperature of the air flowing into the space above region C can be decreased, and thus the increase in the temperature of smoothing capacitors 6 can be mitigated.

In addition, since smoothing capacitors 6 are thermally shielded from secondary-side switching elements 3a, 3b, 3c, 3d with the above arrangement, the increase in the temperature of smoothing capacitors 6 is hardly influenced by the temperature of secondary-side switching elements 3a, 3b, 3c, 3d. Accordingly, secondary-side switching elements 3a, 3b, 3c, 3d can be driven in a higher temperature state than that in a conventional case, to operate the power circuit device. As a result, two effects described below can be expected. First, since the amount of current which can flow to secondary-side switching elements 3a, 3b, 3c, 3d can be increased when compared to that in the conventional case, the power circuit device can provide a higher output. Second, since the heat dissipation area of secondary-side switching elements 3a, 3b, 3c, 3d can be reduced, a region occupied by secondary-side switching elements 3a, 3b, 3c, 3d in the front surface of printed substrate 1 can be reduced, for example, by narrowing a spacing for mounting secondary-side switching elements 3a, 3b, 3c, 3d. That is, the power circuit device can be downsized.

<Configuration and Function/Effect of Variation of Power Circuit Device>

Figure 13:
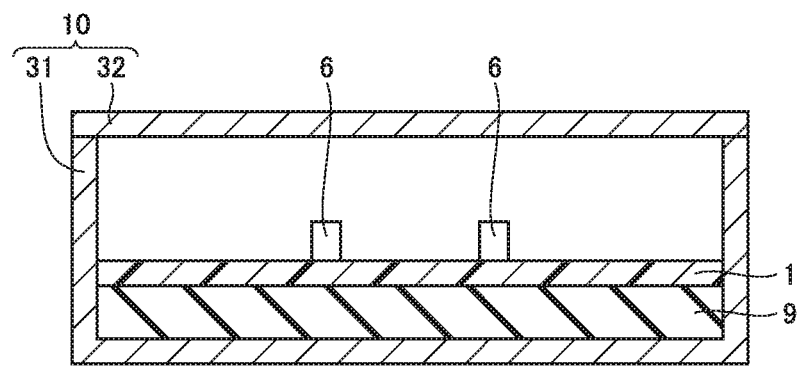
FIG. 13 is a schematic cross sectional view showing a variation of the power circuit device in accordance with the first embodiment of the present invention.

FIG. 13 is a schematic cross sectional view showing a variation of the power circuit device in accordance with the first embodiment of the present invention. Although the power circuit device shown in FIG. 13 basically has the same configuration as that of the power circuit device shown in FIGS. 1 to 12, the shape of housing 10 thereof is different from that of the power circuit device shown in FIGS. 1 to 11. That is, in the power circuit device shown in FIG. 13, housing 10 has a box shape. Printed substrate 1 is arranged inside box-shaped housing 10. Housing 10 includes a box-shaped housing portion 31 having an upper opening, and a lid 32 closing the upper opening. The power circuit device having such a configuration can also obtain the same effect as that of the power circuit device shown in FIGS. 1 to 12.

Second Embodiment

<Configuration and Function/Effect of Power Circuit Device>

Figure 14:
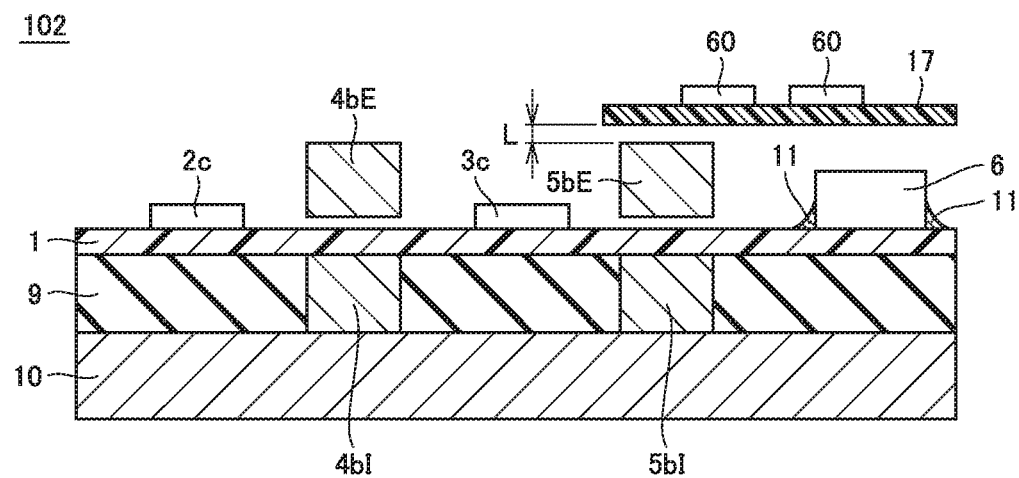
FIG. 14 is a schematic cross sectional view of a power circuit device in accordance with a second embodiment of the present invention.

FIG. 14 is a schematic cross sectional view of a power circuit device in accordance with a second embodiment of the present invention. FIG. 14 is a schematic cross sectional view identical to FIG. 6 in the first embodiment, in the power circuit device in the second embodiment of the present invention. A DC/DC converter 102 in the present embodiment basically has the same configuration as that of DC/DC converter 101 shown in FIGS. 1 to 13. However, as shown in FIG. 14, DC/DC converter 102 in the present embodiment is different from DC/DC converter 101 in the first embodiment in that it includes a heat shield plate 17 serving as a shield member in a space above at least one of smoothing choke coils 5a, 5b and smoothing capacitor 6 mounted on printed substrate 1. It should be noted that, in FIG. 14, heat shield plate 17 is formed to extend from above a smoothing choke coil core to above smoothing capacitor 6. Heat shield plate 17 may be formed only above the smoothing choke coil core of smoothing choke coil 5a, or may be formed only above smoothing capacitor 6.

Referring to FIG. 14, heat shield plate 17 is plate-shaped. Heat shield plate 17 is fixed by means of a post (not shown) connected with housing 10. In the present embodiment, heat shield plate 17 is composed of a resin having a low heat conductivity in order to shield heat. For example, heat shield plate 17 may be composed of an epoxy resin, a PTFE resin, or the like. Alternatively, a plate made of a highly heat conductive metal such as stainless steel (SUS) or aluminum may be used for heat shield plate 17. Also with such a configuration, the presence of heat shield plate 17 can suppress the air heated by heat from secondary-side switching elements 3a, 3b, 3c, 3d from flowing into the vicinity of smoothing capacitors 6. That is, the effect of mitigating the increase in the temperature of smoothing capacitors 6 can be fully obtained.

In addition, heat shield plate 17 may be a portion of housing 10, and may also function as lid 32 of housing 10 shown in FIG. 13, for example. In this case, heat shield plate 17 is preferably composed of the same member as that for housing 10. Further, heat shield plate 17 may also be a control circuit substrate equipped with a control circuit which includes elements 60 (see FIG. 14) and drives DC/DC converter 102. From a different viewpoint, heat shield plate 17 includes the control circuit substrate, and the control circuit having elements 60. The control circuit is formed on the control circuit substrate, and controls DC/DC converter 102 serving as a power circuit. In this case, since the space within housing 10 can be used effectively, the power circuit device can be downsized.

In the present embodiment, a gap (a distance L) between the top (top surface) of E-shaped smoothing choke coil core 5aE, 5bE and heat shield plate 17 is small, and thus the air heated by the switching elements located in region B does not flow into the space above region C. Accordingly, the temperature of the air around smoothing capacitors 6 can be maintained low. Therefore, the increase in the temperature of smoothing capacitors 6 can be mitigated. That is, since the amount of heat flowing into smoothing capacitors 6 through the fourth heat dissipation path of each switching element described in the first embodiment can be reduced, the increase in the temperature of smoothing capacitors 6 can be mitigated.

As described above, by arranging heat shield plate 17, the probability that smoothing capacitors 6 may be broken due to the increase in the temperature of smoothing capacitors 6 can be reduced. As a result, the reliability of the power circuit device can be significantly improved. In addition, since smoothing capacitors 6 are thermally shielded from secondary-side switching elements 3a, 3b, 3c, 3d by heat shield plate 17, the increase in the temperature of smoothing capacitors 6 is hardly influenced by the temperature of secondary-side switching elements 3a, 3b, 3c, 3d. Accordingly, secondary-side switching elements 3a, 3b, 3c, 3d can be driven in a higher temperature state to operate the power circuit device, and thus two effects described below can be expected. First, since the amount of current which can flow to secondary-side switching elements 3a, 3b, 3c, 3d can be increased, the power circuit device can provide a higher output. Second, since the heat dissipation area of secondary-side switching elements 3a, 3b, 3c, 3d can be reduced, the region occupied by secondary-side switching elements 3a, 3b, 3c, 3d in the front surface of printed substrate 1 can be reduced, for example, by narrowing the spacing for mounting secondary-side switching elements 3a, 3b, 3c, 3d. That is, the power circuit device can be downsized.

<Configuration and Function/Effect of Variation of Power Circuit Device>

Figure 15:
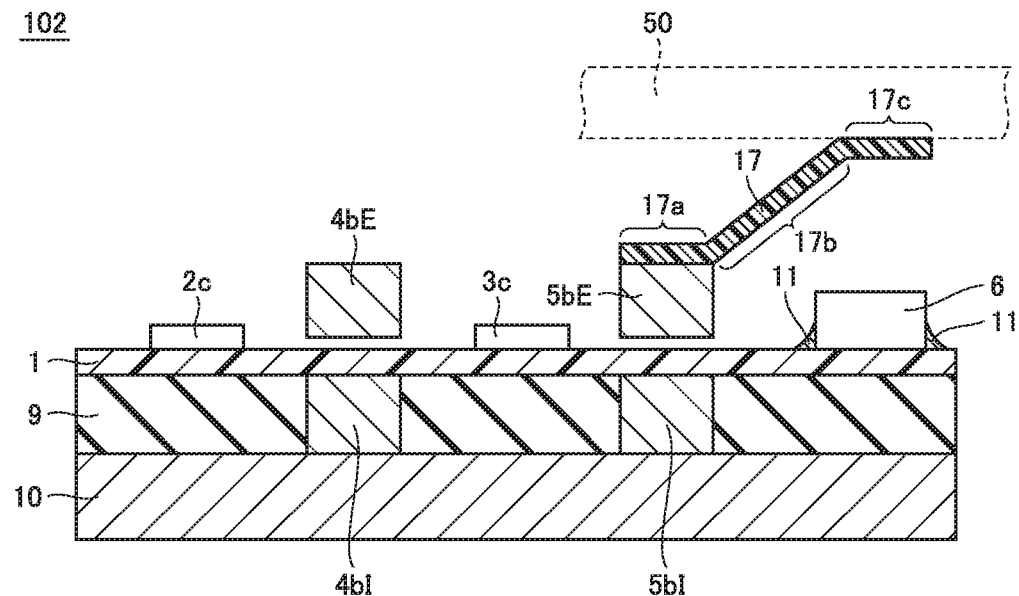
FIG. 15 is a schematic cross sectional view of a variation of the power circuit device in accordance with the second embodiment of the present invention.

FIG. 15 is a schematic cross sectional view of a variation of the power circuit device in accordance with the second embodiment of the present invention. Although the power circuit device shown in FIG. 15 basically has the same configuration as that of the power circuit device shown in FIG. 14, it is different from the power circuit device shown in FIG. 14 in that heat shield plate 17 serving as a shield member is in contact with at least one of E-shaped smoothing choke coil cores 5aE, 5bE. Thereby, the space above region B and the space above region C can be separated by heat shield plate 17. Accordingly, the amount of air flowing from the space above region B into the space above region C can be further reduced. As a result, the increase in the temperature of smoothing capacitors 6 can be further mitigated.

In addition, in this case, when an inclined portion 17b (a portion having an angle) which is inclined with respect to the front surface of printed substrate 1 is formed in heat shield plate 17 as shown in FIG. 15, heat shield plate 17 can have spring property. For example, heat shield plate 17 includes a fixed portion 17a connected with any of smoothing choke coil cores 5aE, 5bE, inclined portion 17b connected to fixed portion 17a, and a leading end portion 17c connected to an end of inclined portion 17b opposite to an end thereof connected to fixed portion 17a. Then, when leading end portion 17c is pressed toward printed substrate 1 by another member 50, for example, E-shaped smoothing choke coil core 5aE, 5bE can be pressed by heat shield plate 17. As a result, an additional effect of improving magnetic property of smoothing choke coils 5a, 5b can also be expected.

Figure 16:
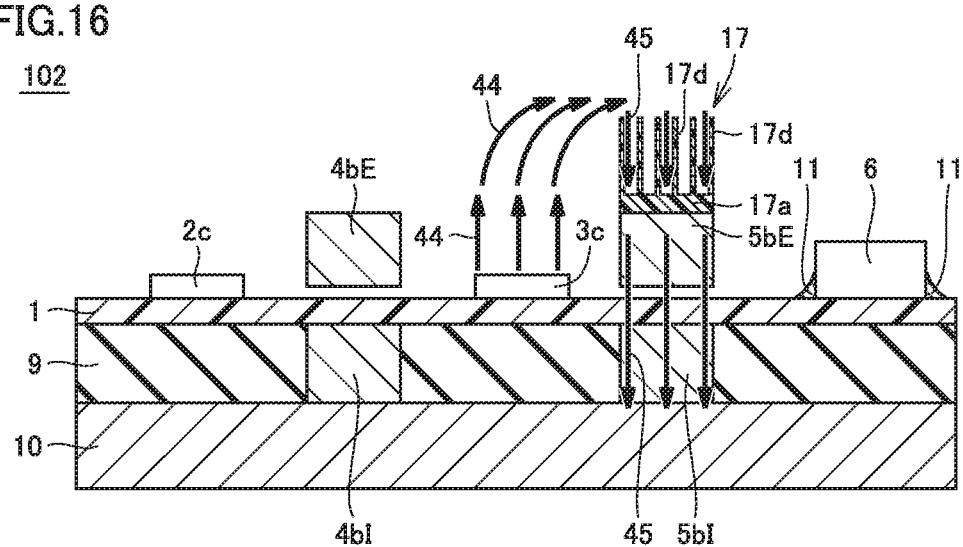
FIG. 16 is a schematic cross sectional view of another variation of the power circuit device in accordance with the second embodiment of the present invention.

FIG. 16 is a schematic cross sectional view of another variation of the power circuit device in accordance with the second embodiment of the present invention. Although the power circuit device shown in FIG. 16 basically has the same configuration as that of the power circuit device shown in FIG. 14, it is different from the power circuit device shown in FIG. 14 in that heat shield plate 17 is configured to include fixed portion 17a and a fin portion 17d formed to protrude from fixed portion 17a. Fixed portion 17a is fixed to a top surface (top) of at least one of E-shaped smoothing choke coil cores 5aE, 5bE. In this case, as shown in FIG. 16, heat shield plate 17 can absorb heat of the air heated by the switching elements, and diffuse the heat to housing 10 through smoothing choke coil cores 5aE, 5aI, 5bE, 5bI.

Here, fin portion 17d of heat shield plate 17 may be plate-shaped or pin-shaped. In a case where fin portion 17d is plate-shaped, fin portion 17d is arranged such that a direction in which fin portion 17d extends is substantially parallel to the longitudinal direction of smoothing choke coil cores 5aE, 5aI, 5bE, 5bI. Thereby, the space above region B and the space above region C can be reliably separated by fin portion 17d. Accordingly, the increase in the temperature of smoothing capacitors 6 located in region C can be further mitigated.

Third Embodiment

<Configuration and Function/Effect of Power Circuit Device>

Figure 17:
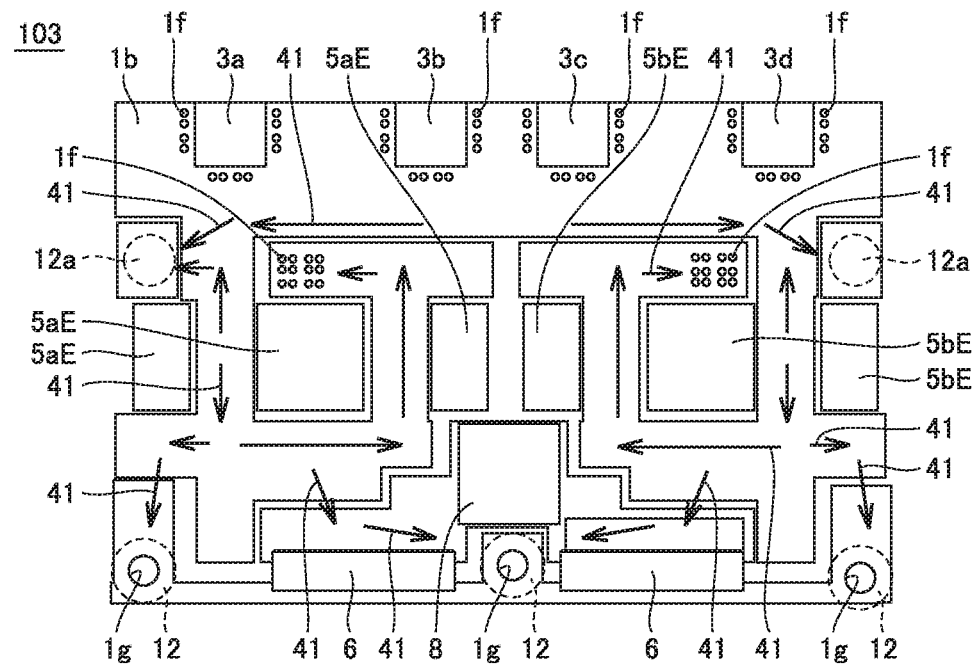
FIG. 17 is a partial schematic top view of a printed substrate of a power circuit device in accordance with a third embodiment of the present invention.

FIG. 17 is a partial schematic top view of printed substrate 1 serving as a circuit substrate of a power circuit device in accordance with a third embodiment of the present invention. FIG. 17 corresponds to FIG. 8 in the first embodiment of the present invention.

Although a DC/DC converter 103 in the present embodiment shown in FIG. 17 basically has the same configuration as that of DC/DC converter 101 in the first embodiment of the present invention, arrangement of fastening members 12, 12a set at the GND potential is different from that in the first embodiment of the present invention. Specifically, in the present embodiment, DC/DC converter 103 further includes fastening members 12a serving as connection members which connect printed substrate 1 and housing 10, as shown in FIG. 17. Fastening members 12a connect housing 10 and a region located between secondary-side switching elements 3a, 3b, 3c, 3d serving as the electric elements and smoothing capacitors 6 serving as the capacitors in printed substrate 1. Thereby, heat from secondary-side switching elements 3a, 3b, 3c, 3d can be transferred to housing 10 through fastening members 12a, and thus the heat can be suppressed from being transferred to smoothing capacitors 6. Accordingly, the increase in the temperature of smoothing capacitors 6 can be suppressed.

For example, in the first embodiment of the present invention, the heat generated by secondary-side switching elements 3a, 3b, 3c, 3d reaches smoothing capacitors 6 through insulating layers 1a and wiring patterns 1b to 1e of printed substrate 1. However, in the present embodiment, the heat generated by secondary-side switching elements 3a, 3b, 3c, 3d is first conducted to fastening members 12a through insulating layers 1a and wiring patterns 1b to 1e of printed substrate 1. Then, the heat is diffused to housing 10 through fastening members 12a.

That is, in the present embodiment, heat transfer to smoothing capacitors 6 can be suppressed in the fourth heat dissipation path of the heat dissipation paths of each switching element described above. Thereby, the amount of heat which reaches smoothing capacitors 6 can be further reduced, when compared with that in the first embodiment of the present invention. Accordingly, the increase in the temperature of smoothing capacitors 6 can be mitigated. As a result, the probability that smoothing capacitors 6 may be broken due to temperature increase is reduced, and the reliability of the power circuit device can be significantly improved.

In addition, with the above configuration, smoothing capacitors 6 are thermally shielded from secondary-side switching elements 3a, 3b, 3c, 3d. Accordingly, the temperature of smoothing capacitors 6 is hardly influenced by the temperature of secondary-side switching elements 3a, 3b, 3c, 3d. Therefore, secondary-side switching elements 3a, 3b, 3c, 3d can be driven in a higher temperature state to operate the power circuit device. Accordingly, as in the second embodiment of the present invention, the power circuit device can provide a higher output, and the power circuit device can be downsized. It should be noted that, although fastening members 12a are arranged at the positions described above in the present embodiment, an equal effect can also be obtained by providing a plurality of heat dissipation vias if at the same positions.

Fourth Embodiment

<Configuration and Function/Effect of Power Circuit Device>

Figure 18:
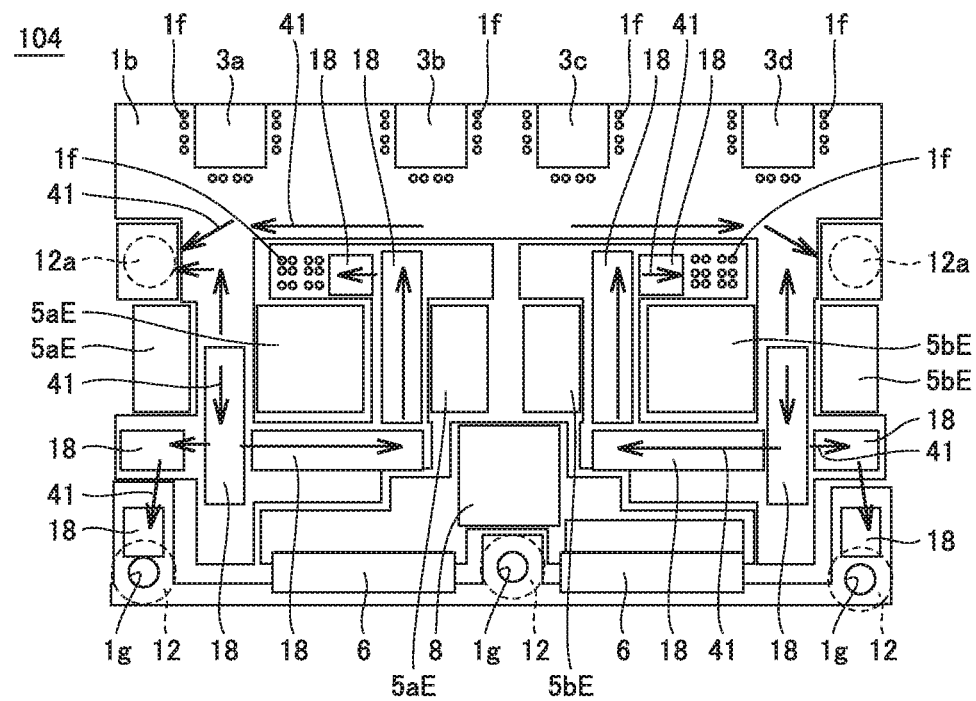
FIG. 18 is a partial schematic top view of a printed substrate of a power circuit device in accordance with a fourth embodiment of the present invention.

FIG. 18 is a partial schematic top view of printed substrate 1 serving as a circuit substrate of a power circuit device in accordance with a fourth embodiment of the present invention. FIG. 18 corresponds to FIG. 8 in the first embodiment of the present invention.

Although a DC/DC converter 104 in the present embodiment shown in FIG. 18 basically has the same configuration as that of DC/DC converter 103 shown in FIG. 17, it is different from DC/DC converter 103 shown in FIG. 17 in that heat diffusion members 18 are fixed to the front surface of printed substrate 1 using bonding member 11. Specifically, DC/DC converter 104 serving as a power circuit device further includes heat diffusion members 18 arranged in a region located between fastening members 12, 12a serving as the connection members and smoothing capacitors 6 serving as the capacitors in printed substrate 1. In the present embodiment, the material constituting heat diffusion members 18 may be copper (Cu). Heat diffusion members 18 are mounted on printed substrate 1 using solder serving as bonding member 11. The material for heat diffusion members 18 may also be a sheet-like material which uses a metal such as gold (Au), a copper (Cu) alloy, a nickel (Ni) alloy, a gold (Au) alloy, a silver (Ag) alloy, or the like, or graphite, as a main material. In addition, since the effect of heat diffusion is reduced when heat diffusion members 18 are too thick, heat diffusion members 18 preferably have a thickness of more than or equal to about 0.5 mm and less than or equal to about 2.0 mm. In addition, each heat diffusion member 18 does not have to have a simple rectangular shape as shown in FIG. 18, and the effect of heat diffusion can also be further enhanced by providing an L-shaped or U-shaped heat diffusion member 18 so as to follow the shape of a pattern on printed substrate 1.

In the third embodiment, the heat generated by secondary-side switching elements 3a, 3b, 3c, 3d is conducted to fastening members 12, 12a through wiring patterns 1b to 1e, and is diffused to housing 10. In the present embodiment, in addition to heat diffusion through wiring patterns 1b to 1e described above, heat diffusion members 18 are mounted on the front surface of printed substrate 1. Since heat diffusion members 18 can conduct heat generated by wiring pattern 1b to fastening members 12, 12a more effectively, the amount of heat transferred to smoothing capacitors 6 can be further reduced. This is because heat diffusion members 18 are utilized to control directions in which the heat is conducted. That is, in the present embodiment, as shown in FIG. 18, rectangular heat diffusion members 18 are mounted to extend from first-layer wiring pattern 1*b* toward heat dissipation vias 1*f* and fastening members 12, 12*a* serving as cooling points which are apart from heat-sensitive smoothing capacitors 6. As a result, heat can be efficiently conducted from first-layer wiring pattern 1*b* toward heat dissipation vias 1*f* and fastening members 12, 12*a*. Accordingly, the amount of heat conducted to smoothing capacitors 6 can be reduced. In addition, when an electrically conductive material is used as the material for heat diffusion members 18, a portion of a current flowing through first-layer wiring pattern 1*b* also flows through heat diffusion members 18. Accordingly, the amount of heat generated in first-layer wiring pattern 1*b* can be reduced. Also in this respect, the effect of reducing the amount of heat conducted to smoothing capacitors 6 can be obtained. Therefore, the probability that smoothing capacitors 6 may be broken due to temperature increase can be reduced, and the reliability of the power circuit device can be significantly improved.

In addition, by arranging heat diffusion members 18 as described above, smoothing capacitors 6 are thermally shielded from secondary-side switching elements 3*a*, 3*b*, 3*c*, 3*d*. Accordingly, the temperature of smoothing capacitors 6 is hardly influenced by the temperature of secondary-side switching elements 3*a*, 3*b*, 3*c*, 3*d*. Therefore, secondary-side switching elements 3*a*, 3*b*, 3*c*, 3*d* can be driven in a higher temperature state to operate the power circuit device. As a result, as in the second embodiment of the present invention, the power circuit device can provide a higher output, and the power circuit device can be downsized.

Fifth Embodiment

<Configuration and Function/Effect of Power Circuit Device>

Figure 19:
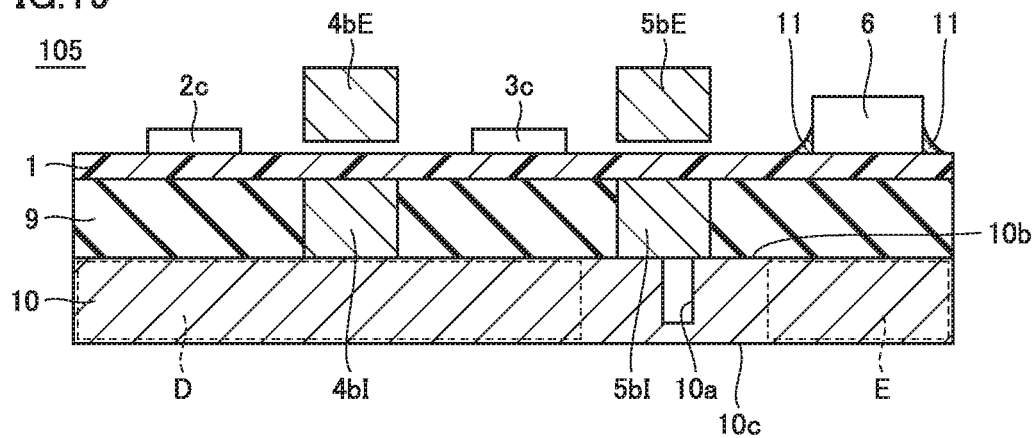
FIG. 19 is a schematic cross sectional view of a power circuit device in accordance with a fifth embodiment of the present invention.

FIG. 19 is a schematic cross sectional view of a power circuit device in accordance with a fifth embodiment of the present invention. FIG. 19 corresponds to FIG. 6 in the first embodiment of the present invention.

Although a DC/DC converter 105 in the present embodiment shown in FIG. 19 basically has the same configuration as that of DC/DC converter 101 shown in FIG. 6, it is different from DC/DC converter 101 shown in FIG. 6 in that a recessed portion 10*a* is formed in a region of housing 10 located below at least one of I-shaped smoothing choke coil cores 5*a*I, 5*b*I. Specifically, in DC/DC converter 105 serving as the power circuit device shown in FIG. 19, housing 10 includes a first housing region (a region E) located below smoothing capacitors 6, a second housing region (a region D) located below secondary-side switching elements 3*a*, 3*b*, 3*c*, 3*d* serving as the electric elements, and a third housing region (the region of housing 10 located below at least one of I-shaped smoothing choke coil cores 5*a*I, 5*b*I) located between the first housing region and the second housing region. The third housing region includes a portion which has a thickness smaller than a thickness of the first housing region (region E) and a thickness of the second housing region (region D) (i.e., a portion of housing 10 facing the bottom of recessed portion 10*a*). Recessed portion 10*a* shown in FIG. 19 has an opening portion on a side close to I-shaped smoothing choke coil core 5*a*I, 5*b*I. That is, recessed portion 10*a* faces any of I-shaped smoothing choke coil cores 5*a*I, 5*b*I.

Here, in the first embodiment of the present invention, smoothing capacitors 6 dissipate heat to housing 10 through printed substrate 1, insulating member 9, and fastening members 12. However, when the temperature of entire housing 10 is increased by heat generation at primary-side switching elements 2*a*, 2*b*, 2*c*, 2*d* serving as the electric elements, transformers 4*a*, 4*b*, and secondary-side switching elements 3*a*, 3*b*, 3*c*, 3*d*, heat dissipation property of smoothing capacitors 6 may be reduced. Thus, in the present embodiment, as shown in FIG. 19, recessed portion 10*a* is provided between region D of housing 10 located below regions A and B and region E located below region C in printed substrate 1. By forming such a recessed portion 10*a*, a region having a relatively small cross sectional area is formed between region D and region E of housing 10, to suppress heat transfer from region D to region E. Thereby, an increase in the temperature of region E in housing 10 can be suppressed even in a case where the temperature of region D is increased due to heat generation from the switching elements and the like. Accordingly, deterioration of the heat dissipation property of smoothing capacitors 6 can be suppressed, and thus the temperature of smoothing capacitors 6 can be maintained low.

<Configuration and Function/Effect of Variation of Power Circuit Device>

Figure 20:
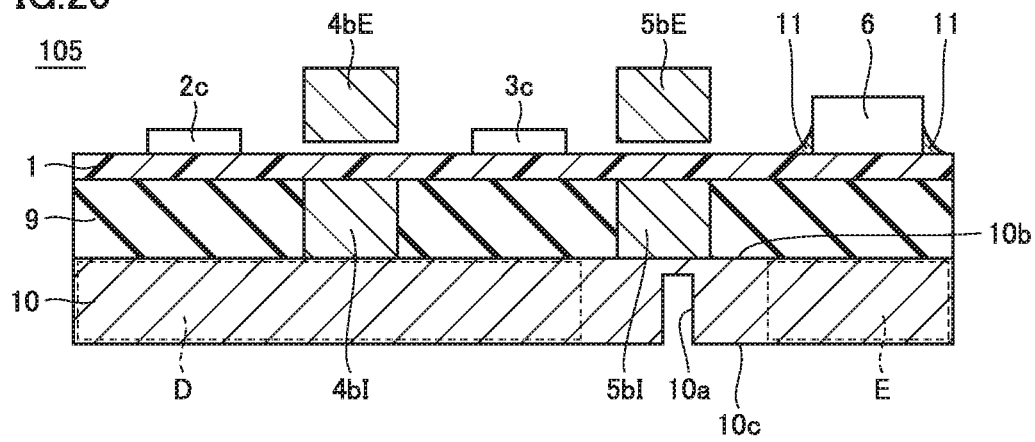
FIG. 20 is a schematic cross sectional view of a variation of the power circuit device in accordance with the fifth embodiment of the present invention.

FIG. 20 is a schematic cross sectional view of a variation of the power circuit device in accordance with the fifth embodiment of the present invention. FIG. 20 corresponds to FIG. 19.

Although DC/DC converter 105 in the present embodiment shown in FIG. 20 basically has the same configuration as that of DC/DC converter 105 shown in FIG. 19, arrangement of recessed portion 10*a* in the region of housing 10 located below I-shaped smoothing choke coil core 5*a*I, 5*b*I is different from that in DC/DC converter 105 shown in FIG. 19. Specifically, in DC/DC converter 105 shown in FIG. 20, recessed portion 10*a* is formed in a surface of housing 10 on a side which is not in contact with insulating member 9. Also with such a configuration, the same effect as that of DC/DC converter 105 shown in FIG. 19 can be obtained. Further, in the configuration shown in FIG. 20, the contact area between I-shaped smoothing choke coil core 5*a*I, 5*b*I and housing 10 is larger than that in the configuration shown in FIG. 19. Accordingly, heat dissipation property from I-shaped smoothing choke coil core 5*a*I, 5*b*I to housing 10 is improved.

As described above, by providing recessed portion 10*a* in housing 10, reduction of the heat dissipation property of smoothing capacitors 6 can be suppressed. Therefore, the probability that smoothing capacitors 6 may be broken due to temperature increase is reduced, and the reliability of the power circuit device can be significantly improved. In addition, since the amount of current flowing to secondary-side switching elements 3*a*, 3*b*, 3*c*, 3*d* can be increased, the power circuit device can provide a higher output.

In addition, with the above configuration, smoothing capacitors 6 are thermally shielded from secondary-side switching elements 3*a*, 3*b*, 3*c*, 3*d*, and thus the temperature of smoothing capacitors 6 is hardly influenced by the temperature of secondary-side switching elements 3*a*, 3*b*, 3*c*, 3*d*. Therefore, secondary-side switching elements 3*a*, 3*b*, 3*c*, 3*d* can be driven in a higher temperature state to operate the power circuit device. As a result, as in the second embodiment of the present invention, the power circuit device can provide a higher output, and the power circuit device can be downsized.

Sixth Embodiment

<Configuration and Function/Effect of Power Circuit Device>

FIG. 21 is a schematic top view of a power circuit device in accordance with a sixth embodiment of the present invention. FIG. 22 is a schematic top view of a variation of the power circuit device shown in FIG. 21. FIGS. 21 and 22 correspond to FIG. 3 in the first embodiment of the present invention.

Although a DC/DC converter 106 in the present embodiment shown in FIG. 21 basically has the same configuration as that of DC/DC converter 101 in the first embodiment of the present invention, arrangement of output terminal 8 is different therefrom. In the sixth embodiment, output terminal 8 is arranged between smoothing choke coil 5a and smoothing choke coil 5b. Smoothing choke coil 5a includes smoothing choke coil cores 5aE, 5aI, as shown in FIG. 4. Smoothing choke coil 5b includes smoothing choke coil cores 5bE, 5bI, as shown in FIG. 4. Output terminal 8 is arranged between smoothing choke coil cores 5aE, 5aI serving as the first coil cores and smoothing choke coil cores 5bE, 5bI serving as the second coil cores.

That is, in this case, output terminal 8 is not arranged in region C, and functions together with smoothing choke coils 5a, 5b to separate region B and region C. Thereby, output terminal 8 can close a gap produced between smoothing choke coil 5a and smoothing choke coil 5b. As a result, heat transfer from region B to region C through the air can be reduced. Here, output terminal 8 may have a height (a height from the front surface of printed substrate 1) which is more than or equal to that of smoothing choke coils 5a, 5b, in order to effectively close the gap described above.

In addition, as a variation of the sixth embodiment, DC/DC converter 106 may be configured as shown in FIG. 22. In DC/DC converter 106 shown in FIG. 22, smoothing choke coil 5a and smoothing choke coil 5b are arranged adjacent to each other. Output terminal 8 is arranged on an end side of printed substrate 1 to be aligned with smoothing choke coils 5a, 5b. That is, output terminal 8 is not arranged in region C, and functions together with smoothing choke coil 5 to separate region B and region C, as with the configuration shown in FIG. 21. Thereby, DC/DC converter 106 has an effect of providing enhanced heat shield between region B and region C, as with the power circuit device shown in FIG. 21.

With the above configuration, smoothing capacitors 6 are thermally shielded from secondary-side switching elements 3a, 3b, 3c, 3d, and thus the temperature of smoothing capacitors 6 is hardly influenced by the temperature of secondary-side switching elements 3a, 3b, 3c, 3d. Therefore, secondary-side switching elements 3a, 3b, 3c, 3d can be driven in a higher temperature state to operate the power circuit device. As a result, as in the second embodiment of the present invention, the power circuit device can provide a higher output, and the power circuit device can be downsized.

Although the embodiments of the present invention have been described above, the above embodiments can also be modified in various manners. In addition, the scope of the present invention is not limited to the above embodiments. The scope of the present invention is defined by the scope of the claims, and is intended to include any modifications within the scope and meaning equivalent to the scope of the claims.

INDUSTRIAL APPLICABILITY

The present invention is particularly advantageously applicable to a power circuit device which transfers heat to a housing for cooling.

REFERENCE SIGNS LIST

1: printed substrate; 1a: insulating layer; 1b to 1e: wiring pattern; 1f: heat dissipation via; 2a to 2d: primary-side switching element; 3a to 3d: secondary-side switching element; 4, 4a: transformer; 4aE, 4aI, 4bE, 4bI: transformer core; 5, 5a, 5b: smoothing choke coil; 5aE, 5aI, 5bE, 5bI: smoothing choke coil core; 6: smoothing capacitor; 7: input terminal; 8: output terminal; 9: insulating member; 10: housing; 10a: recessed portion; 11: bonding member; 12, 12a: fastening member; 13: lead; 14: resonance coil; 15: filter coil; 16: input capacitor; 17: heat shield plate; 17a: fixed portion; 17b: inclined portion; 17c: leading end portion; 17d: fin portion; 18: heat diffusion member; 21, 22, 24, 25: opening portion; 31: housing portion; 32: lid; 41, 42, 43: arrow; 50: member; 60: element; 101, 102, 103, 104, 105: DC/DC converter.

The invention claimed is:

1. A power circuit device comprising:
   a circuit substrate including a plurality of layers, wherein a first layer itself of the plurality of layers is a first-layer wiring pattern and a second layer itself of the plurality of layers is a second-layer wiring pattern;
   a power circuit formed on the circuit substrate; and
   a housing connected with the circuit substrate,
   wherein the power circuit includes
      an electric element including a first plurality of switching elements and a second plurality of switching elements,
      at least one smoothing choke coil which smoothes a current flowing through the power circuit, and
      a capacitor which smoothes a current output from the smoothing choke coil,
   wherein (i) a portion of a core of the smoothing choke coil is inserted in an opening portion formed in the circuit substrate, (ii) windings of the smoothing choke coil are the first-layer wiring pattern of the first layer of the circuit substrate and the second-layer wiring pattern of the second layer of the circuit substrate, and (iii) the smoothing choke coil is located between a first region in which the capacitor is arranged and a second region in which the electric element is arranged,
   a first plurality of heat dissipation vias penetrating the circuit substrate, wherein the first plurality of heat dissipation vias is arranged (i) immediately below at least one of the first plurality of switching elements and the second plurality of switching elements and (ii) around a periphery thereof, and
   a second plurality of heat dissipation vias penetrating the circuit substrate such that an electrical conduction is established between the first-layer wiring pattern and the second-layer wiring pattern from a front surface to a back surface of the circuit substrate.

2. The power circuit device according to claim 1, wherein the opening portion formed in the circuit substrate includes a first opening and a second opening,
   the smoothing choke coil includes a first coil and a second coil,
   the core includes a first coil core and a second coil core, corresponding to the first coil and the second coil, a portion of the first coil core is inserted in the first opening of the circuit substrate, a portion of the second coil core is inserted in the second opening of the circuit substrate, the first coil core and the second coil core are arranged in a line when the circuit substrate is viewed from a main surface, and the first coil core and the second coil core are arranged to traverse between the first region and the second region.

3. The power circuit device according to claim 2, wherein an output terminal is provided between the first coil core and the second coil core.

4. The power circuit device according to claim 1, wherein, of a first height from a front surface of the circuit substrate to a top of the second plurality of switching elements, a second height from the front surface of the circuit substrate to a top of the capacitor, and a third height from the front surface of the circuit substrate to a top of the core, the third height is highest.

5. The power circuit device according to claim 1, wherein the power circuit further includes at least one transformer, the transformer has a transformer core and a winding surrounding a periphery of the transformer core, at least one transformer opening portion is formed in a region between the first plurality of switching elements and the second plurality of switching elements in the circuit substrate, and a portion of the transformer core is inserted in the transformer opening portion of the circuit substrate.

6. The power circuit device according to claim 5, wherein the transformer includes a first transformer and a second transformer, the transformer opening portion formed in the circuit substrate includes a first transformer opening and a second transformer opening, a portion of the transformer core of the first transformer is inserted in the first transformer opening of the circuit substrate, and a portion of the transformer core of the second transformer is inserted in the second transformer opening of the circuit substrate.

7. The power circuit device according to claim 5, wherein, of a fourth height from a front surface of the circuit substrate to a top of the first plurality of switching elements, a fifth height from the front surface of the circuit substrate to a top of the second plurality of switching elements, and a sixth height from the front surface of the circuit substrate to a top of the transformer core, the sixth height is highest.

8. The power circuit device according to claim 1, further comprising a shield member arranged above the core of the smoothing choke coil.

9. The power circuit device according to claim 8, wherein the shield member is in contact with the core.

10. The power circuit device according to claim 8, wherein the shield member includes a control circuit substrate, and a control circuit formed on the control circuit substrate for controlling the power circuit.

11. The power circuit device according to claim 1, further comprising a connection member which connects the circuit substrate and the housing, wherein the connection member connects the housing and a region located between the electric element and the capacitor in the circuit substrate.

12. The power circuit device according to claim 11, further comprising a heat diffusion member arranged in a region located between the connection member and the capacitor in the circuit substrate.

13. The power circuit device according to claim 1, wherein the housing includes a first housing region located below the capacitor, a second housing region located below the electric element, and a third housing region located between the first housing region and the second housing region, and the third housing region includes a portion which has a thickness smaller than a thickness of the first housing region and a thickness of the second housing region.

* * * * *